United States Patent
Anthony et al.

(10) Patent No.: US 7,688,565 B2
(45) Date of Patent: Mar. 30, 2010

(54) ARRANGEMENTS FOR ENERGY CONDITIONING

(75) Inventors: Anthony A. Anthony, Erie, PA (US); William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 26 days.

(21) Appl. No.: 12/030,253

(22) Filed: Feb. 13, 2008

(65) Prior Publication Data

US 2009/0161283 A1 Jun. 25, 2009

Related U.S. Application Data

(63) Continuation of application No. 10/479,506, filed as application No. PCT/US02/21238 on Jul. 2, 2002, now Pat. No. 7,336,468, which is a continuation-in-part of application No. 10/023,467, filed on Dec. 17, 2001, now abandoned, which is a continuation-in-part of application No. 09/996,355, filed on Nov. 29, 2001, now abandoned, which is a continuation-in-part of application No. 10/003,711, filed on Nov. 15, 2001, now abandoned, which is a continuation-in-part of application No. 09/982,553, filed on Oct. 17, 2001, now abandoned, said application No. 10/479,506 is a continuation-in-part of application No. 10/115,159, filed on Apr. 2, 2002, now Pat. No. 6,894,884, which is a continuation-in-part of application No. 09/845,680, filed on Apr. 30, 2001, now Pat. No. 6,580,595, which is a continuation-in-part of application No. 09/777,021, filed on Feb. 5, 2001, now Pat. No. 6,687,108, which is a continuation-in-part of application No. 09/632,048, filed on Aug. 3, 2000, now Pat. No. 6,738,249, which is a continuation-in-part of application No. 09/594,447, filed on Jun. 15, 2000, now Pat. No. 6,636,406, which is a continuation-in-part of application No. 09/579,606, filed on May 26, 2000, now Pat. No. 6,373,673, which is a continuation-in-part of application No. 09/460,218, filed on Dec. 13, 1999, now Pat. No. 6,331,926, which is a continuation-in-part of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/280,819, filed on Apr. 2, 2001, provisional application No. 60/302,429, (Continued)

(51) Int. Cl.
*H02H 9/00* (2006.01)
(52) U.S. Cl. ...................................... 361/118
(58) Field of Classification Search ............ 361/118
See application file for complete search history.

(56) References Cited

U.S. PATENT DOCUMENTS 3,240,621 A  3/1966  Flower, Jr. et al.

(Continued)

FOREIGN PATENT DOCUMENTS

DE  197 28 692 A1  1/1999

(Continued)

OTHER PUBLICATIONS

Oct. 1, 2002, PCT International Search Report for PCT/US01/48861.

(Continued)

*Primary Examiner*—Stephen W Jackson
(74) *Attorney, Agent, or Firm*—Kenneth C. Spafford

(57) ABSTRACT

Circuit arrangement embodiments that use relative groupings of energy pathways that include shielding circuit arrangements that can sustain and condition electrically complementary energy confluences.

20 Claims, 7 Drawing Sheets

Related U.S. Application Data filed on Jul. 2, 2001, provisional application No. 60/310,962, filed on Aug. 8, 2001, provisional application No. 60/200,327, filed on Apr. 28, 2000, provisional application No. 60/215,314, filed on Jun. 30, 2000, provisional application No. 60/225,497, filed on Aug. 15, 2000, provisional application No. 60/255,818, filed on Dec. 15, 2000, provisional application No. 60/180,101, filed on Feb. 3, 2000, provisional application No. 60/185,320, filed on Feb. 28, 2000, provisional application No. 60/191,196, filed on Mar. 22, 2000, provisional application No. 60/203,863, filed on May 12, 2000, provisional application No. 60/241,128, filed on Oct. 17, 2000, provisional application No. 60/248,914, filed on Nov. 15, 2000, provisional application No. 60/252,766, filed on Nov. 22, 2000, provisional application No. 60/253,793, filed on Nov. 29, 2000, provisional application No. 60/146,987, filed on Aug. 3, 1999, provisional application No. 60/165,035, filed on Nov. 12, 1999, provisional application No. 60/139,182, filed on Jun. 15, 1999, provisional application No. 60/136,451, filed on May 28, 1999, provisional application No. 60/349,954, filed on Jan. 8, 2002, provisional application No. 60/388,388, filed on Jun. 12, 2002.

(56) References Cited

U.S. PATENT DOCUMENTS

| | | |
|---|---|---|
| 3,343,034 A | 9/1967 | Ovshinsky |
| 3,379,943 A | 4/1968 | Breedlove |
| 3,573,677 A | 4/1971 | Detar |
| 3,736,471 A | 5/1973 | Donze et al. |
| 3,742,420 A | 6/1973 | Harnden, Jr. |
| 3,790,858 A | 2/1974 | Brancaleone et al. |
| 3,842,374 A | 10/1974 | Schlicke |
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,592,606 A | 6/1986 | Mudra |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,062 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,162,977 A | 11/1992 | Paurus et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,206,786 A | 4/1993 | Lee |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |

| | | | | | |
|---|---|---|---|---|---|
| 5,268,810 A | 12/1993 | DiMarco et al. | 5,708,553 A | 1/1998 | Hung |
| 5,290,191 A | 3/1994 | Foreman et al. | 5,719,450 A | 2/1998 | Vora |
| 5,299,956 A | 4/1994 | Brownell et al. | 5,719,477 A | 2/1998 | Tomihari |
| 5,300,760 A | 4/1994 | Batliwalla et al. | 5,719,750 A | 2/1998 | Iwane |
| 5,310,363 A | 5/1994 | Brownell et al. | 5,741,729 A | 4/1998 | Selna |
| 5,311,408 A | 5/1994 | Ferchau et al. | 5,751,539 A | 5/1998 | Stevenson et al. |
| 5,319,525 A | 6/1994 | Lightfoot | 5,767,446 A | 6/1998 | Ha et al. |
| 5,321,373 A | 6/1994 | Shusterman et al. | 5,789,999 A | 8/1998 | Barnett et al. |
| 5,321,573 A | 6/1994 | Person et al. | 5,790,368 A | 8/1998 | Naito et al. |
| 5,326,284 A | 7/1994 | Bohbot et al. | 5,796,568 A | 8/1998 | Baiatu |
| 5,337,028 A | 8/1994 | White | 5,796,595 A | 8/1998 | Cross |
| 5,353,189 A | 10/1994 | Tomlinson | 5,797,770 A | 8/1998 | Davis et al. |
| 5,353,202 A | 10/1994 | Ansell et al. | 5,808,873 A | 9/1998 | Celaya et al. |
| 5,357,568 A | 10/1994 | Pelegris | 5,822,174 A | 10/1998 | Yamate et al. |
| 5,362,249 A | 11/1994 | Carter | 5,825,084 A | 10/1998 | Lau et al. |
| 5,362,254 A | 11/1994 | Siemon et al. | 5,825,628 A | 10/1998 | Garbelli et al. |
| 5,378,407 A | 1/1995 | Chandler et al. | 5,828,093 A | 10/1998 | Naito et al. |
| 5,382,928 A | 1/1995 | Davis et al. | 5,828,272 A | 10/1998 | Romerein et al. |
| 5,382,938 A | 1/1995 | Hansson et al. | 5,828,555 A | 10/1998 | Itoh |
| 5,386,335 A | 1/1995 | Amano et al. | 5,831,489 A | 11/1998 | Wire |
| 5,396,201 A | 3/1995 | Ishizaki et al. | 5,834,992 A | 11/1998 | Kato et al. |
| 5,401,952 A | 3/1995 | Sugawa | 5,838,216 A | 11/1998 | White et al. |
| 5,405,466 A | 4/1995 | Naito et al. | 5,847,936 A | 12/1998 | Forehand et al. |
| 5,414,393 A | 5/1995 | Rose et al. | 5,867,361 A | 2/1999 | Wolf et al. |
| 5,414,587 A | 5/1995 | Kiser et al. | 5,870,272 A | 2/1999 | Seifried et al. |
| 5,420,553 A | 5/1995 | Sakamoto et al. | 5,875,099 A | 2/1999 | Maesaka et al. |
| 5,432,484 A | 7/1995 | Klas et al. | 5,880,925 A | 3/1999 | DuPre et al. |
| 5,446,625 A | 8/1995 | Urbish et al. | 5,889,445 A | 3/1999 | Ritter et al. |
| 5,450,278 A | 9/1995 | Lee et al. | 5,895,990 A | 4/1999 | Lau |
| 5,451,919 A | 9/1995 | Chu et al. | 5,898,403 A | 4/1999 | Saitoh et al. |
| RE35,064 E | 10/1995 | Hernandez | 5,898,562 A | 4/1999 | Cain et al. |
| 5,455,734 A | 10/1995 | Foreman et al. | 5,905,627 A | 5/1999 | Brendel et al. |
| 5,461,351 A | 10/1995 | Shusterman | 5,907,265 A | 5/1999 | Sakuragawa et al. |
| 5,463,232 A | 10/1995 | Yamashita et al. | 5,908,151 A | 6/1999 | Elias |
| 5,471,035 A | 11/1995 | Holmes | 5,909,155 A | 6/1999 | Anderson et al. |
| 5,477,933 A | 12/1995 | Nguyen | 5,909,350 A | 6/1999 | Anthony |
| 5,481,238 A | 1/1996 | Carsten et al. | 5,910,755 A | 6/1999 | Mishiro et al. |
| 5,483,407 A | 1/1996 | Anastasio et al. | 5,912,809 A | 6/1999 | Steigerwald et al. |
| 5,483,413 A | 1/1996 | Babb | 5,917,388 A | 6/1999 | Tronche et al. |
| 5,488,540 A | 1/1996 | Hatta | 5,926,377 A | 7/1999 | Nakao et al. |
| 5,491,299 A | 2/1996 | Naylor et al. | 5,928,076 A | 7/1999 | Clements et al. |
| 5,493,260 A | 2/1996 | Park | 5,955,930 A | 9/1999 | Anderson et al. |
| 5,495,180 A | 2/1996 | Huang et al. | 5,959,829 A | 9/1999 | Stevenson et al. |
| 5,500,629 A | 3/1996 | Meyer | 5,959,846 A | 9/1999 | Noguchi et al. |
| 5,500,785 A | 3/1996 | Funada | 5,969,461 A | 10/1999 | Anderson et al. |
| 5,512,196 A | 4/1996 | Mantese et al. | 5,977,845 A | 11/1999 | Kitahara |
| 5,531,003 A | 7/1996 | Seifried et al. | 5,978,231 A | 11/1999 | Tohya et al. |
| 5,534,837 A | 7/1996 | Brandt | 5,980,718 A | 11/1999 | Van Konynenburg et al. |
| 5,535,101 A | 7/1996 | Miles et al. | 5,995,352 A | 11/1999 | Gumley |
| 5,536,978 A | 7/1996 | Cooper et al. | 5,999,067 A | 12/1999 | D'Ostilio |
| 5,541,482 A | 7/1996 | Siao | 5,999,398 A | 12/1999 | Makl et al. |
| 5,544,002 A | 8/1996 | Iwaya et al. | 6,004,752 A | 12/1999 | Loewy et al. |
| 5,546,058 A | 8/1996 | Azuma et al. | 6,013,957 A | 1/2000 | Puzo et al. |
| 5,548,255 A | 8/1996 | Spielman | 6,016,095 A | 1/2000 | Herbert |
| 5,555,150 A | 9/1996 | Newman, Jr. | 6,018,448 A | 1/2000 | Anthony |
| 5,568,348 A | 10/1996 | Foreman et al. | 6,021,564 A | 2/2000 | Hanson |
| 5,570,278 A | 10/1996 | Cross | 6,023,406 A | 2/2000 | Kinoshita et al. |
| 5,583,359 A | 12/1996 | Ng et al. | 6,031,710 A | 2/2000 | Wolf et al. |
| 5,586,007 A | 12/1996 | Funada | 6,034,576 A | 3/2000 | Kuth |
| 5,590,016 A | 12/1996 | Fujishiro | 6,034,864 A | 3/2000 | Naito et al. |
| 5,592,391 A | 1/1997 | Muyshondt et al. | 6,037,846 A | 3/2000 | Oberhammer |
| 5,612,657 A | 3/1997 | Kledzik | 6,038,121 A | 3/2000 | Naito et al. |
| 5,614,881 A | 3/1997 | Duggal et al. | 6,042,685 A | 3/2000 | Shinada et al. |
| 5,619,079 A | 4/1997 | Wiggins et al. | 6,046,898 A | 4/2000 | Seymour et al. |
| 5,624,592 A | 4/1997 | Paustian | 6,052,038 A | 4/2000 | Savicki |
| 5,640,048 A | 6/1997 | Selna | 6,061,227 A | 5/2000 | Nogi |
| 5,645,746 A | 7/1997 | Walsh | 6,064,286 A | 5/2000 | Ziegner et al. |
| 5,647,766 A | 7/1997 | Nguyen | 6,072,687 A | 6/2000 | Naito et al. |
| 5,647,767 A | 7/1997 | Scheer et al. | 6,075,211 A | 6/2000 | Tohya et al. |
| 5,668,511 A | 9/1997 | Furutani et al. | 6,078,117 A | 6/2000 | Perrin et al. |
| 5,682,303 A | 10/1997 | Goad | 6,078,229 A | 6/2000 | Funada et al. |
| 5,692,298 A | 12/1997 | Goetz et al. | 6,084,779 A | 7/2000 | Fang |
| 5,700,167 A | 12/1997 | Pharney et al. | 6,088,235 A | 7/2000 | Chiao et al. |

| | | | |
|---|---|---|---|
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,160,705 A | 12/2000 | Stearns et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,004 B1 | 1/2001 | Koontz et al. |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,472 B1 | 2/2001 | Mazumder |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,373 B1 | 4/2001 | Novak et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,281,704 B2 | 8/2001 | Ngai et al. |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,288,906 B1 | 9/2001 | Sprietsma et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamomoto et al. |
| 6,331,926 B1 | 12/2001 | Anthony |
| 6,331,930 B1 | 12/2001 | Kuroda |
| 6,342,681 B1 | 1/2002 | Goldberger et al. |
| 6,346,743 B1 | 2/2002 | Figueroa et al. |
| 6,352,914 B2 | 3/2002 | Ball et al. |
| 6,353,540 B1 | 3/2002 | Akiba |
| 6,373,673 B1 | 4/2002 | Anthony |
| 6,388,207 B1 | 5/2002 | Figueroa et al. |
| 6,388,856 B1 | 5/2002 | Anthony |
| 6,395,996 B1 | 5/2002 | Tsai et al. |
| 6,448,873 B1 | 9/2002 | Mostov |
| 6,456,481 B1 | 9/2002 | Stevenson |
| 6,469,595 B2 | 10/2002 | Anthony et al. |
| 6,498,710 B1 | 12/2002 | Anthony |
| 6,504,451 B1 | 1/2003 | Yamaguchi |
| 6,509,640 B1 | 1/2003 | Li et al. |
| 6,509,807 B1 | 1/2003 | Anthony et al. |
| 6,510,038 B1 | 1/2003 | Satou et al. |
| 6,522,516 B2 | 2/2003 | Anthony |
| 6,549,389 B2 | 4/2003 | Anthony et al. |
| 6,559,484 B1 | 5/2003 | Li et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,372 B1 | 8/2003 | Ishizaki et al. |
| 6,603,646 B2 | 8/2003 | Anthony et al. |
| 6,606,011 B2 | 8/2003 | Anthony et al. |
| 6,606,237 B1 | 8/2003 | Naito et al. |
| 6,608,538 B2 | 8/2003 | Wang |
| 6,618,268 B2 | 9/2003 | Dibene, II et al. |
| 6,636,406 B1 | 10/2003 | Anthony |
| 6,650,525 B2 | 11/2003 | Anthony |
| 6,687,108 B1 | 2/2004 | Anthony et al. |
| 6,696,952 B2 | 2/2004 | Zirbes |
| 6,717,301 B2 | 4/2004 | De Daran et al. |
| 6,738,249 B1 | 5/2004 | Anthony et al. |
| 6,806,806 B2 | 10/2004 | Anthony |
| 6,873,513 B2 | 3/2005 | Anthony |
| 6,894,884 B2 | 5/2005 | Anthony, Jr. et al. |
| 6,950,293 B2 | 9/2005 | Anthony |
| 6,954,346 B2 | 10/2005 | Anthony |
| 6,995,983 B1 | 2/2006 | Anthony et al. |
| 7,042,303 B2 | 5/2006 | Anthony et al. |
| 7,042,703 B2 | 5/2006 | Anthony et al. |
| 7,050,284 B2 | 5/2006 | Anthony |
| 7,106,570 B2 | 9/2006 | Anthony, Jr. et al. |
| 7,110,227 B2 | 9/2006 | Anthony et al. |
| 7,110,235 B2 | 9/2006 | Anthony, Jr. et al. |
| 7,113,383 B2 | 9/2006 | Anthony et al. |
| 7,141,899 B2 | 11/2006 | Anthony et al. |
| 7,180,718 B2 | 2/2007 | Anthony et al. |
| 7,193,831 B2 | 3/2007 | Anthony |
| 7,224,564 B2 | 5/2007 | Anthony |
| 7,262,949 B2 | 8/2007 | Anthony |

| | | |
|---|---|---|
| 7,274,549 B2 | 9/2007 | Anthony |
| 7,301,748 B2 | 11/2007 | Anthony et al. |
| 7,321,485 B2 | 1/2008 | Anthony et al. |
| 7,336,467 B2 | 2/2008 | Anthony et al. |
| 7,336,468 B2 * | 2/2008 | Anthony et al. ............ 361/118 |
| 7,423,860 B2 | 9/2008 | Anthony et al. |
| 7,428,134 B2 | 9/2008 | Anthony |
| 7,440,252 B2 | 10/2008 | Anthony |
| 7,443,647 B2 | 10/2008 | Anthony |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0024787 A1 | 2/2002 | Anthony |
| 2002/0027263 A1 | 3/2002 | Anthony et al. |
| 2002/0027760 A1 | 3/2002 | Anthony |
| 2002/0044401 A1 | 4/2002 | Anthony et al. |
| 2002/0075096 A1 | 6/2002 | Anthony |
| 2002/0079116 A1 | 6/2002 | Anthony |
| 2002/0089812 A1 | 7/2002 | Anthony et al. |
| 2002/0113663 A1 | 8/2002 | Anthony et al. |
| 2002/0122286 A1 | 9/2002 | Anthony |
| 2002/0131231 A1 | 9/2002 | Anthony |
| 2002/0149900 A1 | 10/2002 | Anthony |
| 2002/0158515 A1 | 10/2002 | Anthony, Jr. et al. |
| 2002/0186100 A1 | 12/2002 | Anthony et al. |
| 2003/0029632 A1 | 2/2003 | Anthony, Jr. et al. |
| 2003/0029635 A1 | 2/2003 | Anthony, Jr. et al. |
| 2003/0048029 A1 | 3/2003 | DeDaran et al. |
| 2003/0067730 A1 | 4/2003 | Anthony et al. |
| 2003/0161086 A1 | 8/2003 | Anthony |
| 2003/0202312 A1 | 10/2003 | Anthony et al. |
| 2003/0206388 A9 | 11/2003 | Anthony et al. |
| 2003/0210125 A1 | 11/2003 | Anthony |
| 2003/0231451 A1 | 12/2003 | Anthony |
| 2003/0231456 A1 | 12/2003 | Anthony et al. |
| 2004/0004802 A1 | 1/2004 | Anthony et al. |
| 2004/0008466 A1 | 1/2004 | Anthony et al. |
| 2004/0027771 A1 | 2/2004 | Anthony |
| 2004/0032304 A1 | 2/2004 | Anthony et al. |
| 2004/0054426 A1 | 3/2004 | Anthony |
| 2004/0085699 A1 | 5/2004 | Anthony |
| 2004/0105205 A1 | 6/2004 | Anthony et al. |
| 2004/0124949 A1 | 7/2004 | Anthony et al. |
| 2004/0130840 A1 | 7/2004 | Anthony |
| 2004/0218332 A1 | 11/2004 | Anthony et al. |
| 2004/0226733 A1 | 11/2004 | Anthony et al. |
| 2005/0016761 A9 | 1/2005 | Anthony, Jr. et al. |
| 2005/0018374 A1 | 1/2005 | Anthony |
| 2005/0063127 A1 | 3/2005 | Anthony |
| 2005/0248900 A1 | 11/2005 | Anthony |
| 2005/0286198 A1 | 12/2005 | Anthony et al. |
| 2006/0023385 A9 | 2/2006 | Anthony et al. |
| 2006/0139836 A1 | 6/2006 | Anthony |
| 2006/0139837 A1 | 6/2006 | Anthony et al. |
| 2006/0193051 A1 | 8/2006 | Anthony et al. |
| 2006/0203414 A1 | 9/2006 | Anthony |
| 2007/0019352 A1 | 1/2007 | Anthony |
| 2007/0047177 A1 | 3/2007 | Anthony |
| 2007/0057359 A1 | 3/2007 | Anthony et al. |
| 2007/0103839 A1 | 5/2007 | Anthony et al. |
| 2007/0109709 A1 | 5/2007 | Anthony et al. |
| 2008/0160681 A1 | 7/2008 | Anthony et al. |
| 2009/0321127 A1 | 12/2009 | Anthony et al. |

FOREIGN PATENT DOCUMENTS

| | | |
|---|---|---|
| DE | 198 57 043 C1 | 3/2000 |
| EP | 0623363 | 11/1994 |
| EP | 98915364 | 11/1994 |
| EP | 0776016 | 5/1997 |
| EP | 0933871 | 8/1999 |
| EP | 1022751 | 7/2000 |
| EP | 1024507 | 8/2000 |
| EP | 1061535 | 12/2000 |
| EP | 1128434 | 8/2001 |
| EP | 1873872 | 12/2008 |
| FR | 2496970 | 6/1982 |
| FR | 2606207 | 5/1988 |
| FR | 2765417 | 12/1998 |
| FR | 2808135 | 10/2001 |
| GB | 2217136 | 4/1988 |
| GB | 2341980 | 3/2000 |
| JP | 57-172130 | 10/1982 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 05-299292 | 11/1993 |

| | | |
|---|---|---|
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 6-302471 | 10/1994 |
| JP | 06-325977 | 11/1994 |
| JP | 07-022757 | 1/1995 |
| JP | 07 161568 | 6/1995 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 8172025 | 7/1996 |
| JP | 9-266130 | 10/1997 |
| JP | 09-284077 | 10/1997 |
| JP | 09-284078 | 10/1997 |
| JP | 9-294041 | 11/1997 |
| JP | 10-12490 | 1/1998 |
| JP | 11-97291 | 4/1999 |
| JP | 11-21456 | 8/1999 |
| JP | 11-214256 | 8/1999 |
| JP | 11-223396 | 8/1999 |
| JP | 11-219824 | 10/1999 |
| JP | 11-294908 | 10/1999 |
| JP | 11-305302 | 11/1999 |
| JP | 11-319222 | 11/1999 |
| JP | 11-345273 | 12/1999 |
| JP | 2000-188218 | 4/2000 |
| JP | 2000-243646 | 8/2000 |
| JP | 2000-286665 | 10/2000 |
| WO | WO 91/15046 | 10/1991 |
| WO | WO 97/20332 | 6/1997 |
| WO | WO 97/43786 | 11/1997 |
| WO | WO 98/45921 | 10/1998 |
| WO | WO 99/04457 | 1/1999 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | 01/06631 | 1/2001 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/27794 | 4/2002 |
| WO | WO 02/33798 | 4/2002 |
| WO | WO 02/45233 | 6/2002 |
| WO | WO 02/065606 | 8/2002 |
| WO | WO 02/080330 | 10/2002 |
| WO | WO 03/005541 | 1/2003 |
| WO | WO 2004/070905 | 8/2004 |
| WO | WO 2005/002018 | 1/2005 |
| WO | WO 2005/015719 | 2/2005 |
| WO | WO 2005/065097 | 7/2005 |
| WO | WO 2006/093830 | 9/2006 |
| WO | WO 2006/093831 | 9/2006 |
| WO | WO 2006/099297 | 9/2006 |
| WO | WO 2006/104613 | 10/2006 |
| WO | WO 2007/103965 | 9/2007 |

OTHER PUBLICATIONS

Jan. 2, 2003, PCT International Search Report for PCT/US01/44681.

Jan. 1, 1994, Greb, "An Intuitive Approach to EM Fields," EMC Test & Design, Jan. 1991, pp. 30-33.

Dec. 1, 1993, Greb, "An Intuitive Approach to EM Coupling," EMC Test & Design, Dec. 1993, pp. 20-25.

Jun. 1, 1986, Sakamoto, "Noiseproof Power Supplies: What's Important in EMI Removal Filters?" JEE, Jun. 1986, pp. 80-85.

Jan. 1, 1999, Montrose, "Analysis on Loop Area Trace Radiated Emissions from Decoupling Capacitor Placement on Printed Circuit Boards," IEEE, 1999, pp. 423- 428.

Jan. 1, 1999, Miyoshi, "Surface Mounted Distributed Constant Type Noise Filter," IEEE, 1999, pp. 157-160.

Jan. 1, 1999, Shigeta et al., "Improved EMI Performance by Use of a Three-Terminal-Capacitor Applied to an IC Power Line," IEEE, 1999, pp. 161-164.

Jul. 19, 1999, PCT International Search Report for PCT/US99/07653.

Oct. 13, 1999, IPER for PCT/US99/07653.

U.S. Appl. No. 10/479,506, Claims 1-46 from Preliminary Amendment filed Dec. 10, 2003.

U.S. Appl. No. 10/189,339, Claims 1-41 from Preliminary Amendment filed Oct. 28, 2003.

U.S. Appl. No. 10/443,792, Claims 1-41 from Preliminary Amendment filed Oct. 28, 2003.

Aug. 19, 1998, PCT International Search Report for PCT/US98/06962.

Apr. 19, 1999, PCT International Search Report for PCT/US99/01040.

Sep. 18, 2000, PCT International Search Report for PCT/US00/11409.

Sep. 13, 2000, PCT International Search Report for PCT/US00/14626.

Nov. 8, 2000, PCT International Search Report for PCT/US00/16518.

Dec. 28, 2000, PCT International Search Report for PCT/US00/21178.

Fang et al., "Conductive Polymers Prolong Circuit Life," Design News, date unknown, 3 pages.

Sep. 1, 1996, Carpenter, Jr. et al., "A New Approach to TVSS Design," Power Quality Assurance, Sep./Oct. 1996, p. 60-63.

Jan. 1, 1996, Raychem, "Polyswitch Resettable Fuses," Circuit Protection Databook, Jan. 1996, pp. 11-18.

Dec. 28, 2001, PCT International Search Report for PCT/US01/41720.

Jun. 13, 2001, PCT International Search Report for PCT/US01/09185.

Jul. 1, 2000, Polka et al., "Package-Level Interconnect Design for Optimum Electrical Performance," Intel Technology Journal Q3, 2000, pp. 1-17.

May 10, 2002, PCT International Search Report for PCT/US01/43418.

Mar. 13, 2002, PCT International Search Report for PCT/US01/32480.

Aug. 19, 2002, PCT International Search Report for PCT/US02/10302.

Feb. 28, 2003, PCT International Search Report for PCT/US02/21238.

Mar. 18, 2002, PCT International Search Report for PCT/US01/13911.

Jul. 16, 1991, PCT International Search Report for PCT/US91/02150.

Jun. 28, 2001, PCT International Search Report for PCT/US01/03792.

Dec. 16, 1998, "Johanson Dielectrics, Inc. Licenses X2Y Circuit Conditioning Technology," Press Release, Dec. 16, 1998, 1 page.

Mar. 1, 1997, Beyne et al., "PSGA—an innovative IC package for single and multichip designs," Components, Mar. 1997, pp. 6-9.
Sep. 15, 1997, "EMC Design for Brush Commutated DC Electric Motors," Sep. 15, 1997, pp. 1-2.
Apr. 1, 1996, "Tomorrow's Capacitors," Components, 1996, No. 4, p. 3.
Mar. 30, 1998, Mason, "Valor—Understanding Common Mode Noise," Mar. 30, 1998, pp. 1-7.
Anthony Anthony et al. Pending specification, claims, figures for U.S. Appl. No. 10/237,079, Claims 21-81; filed Sep. 9, 2002.
David Anthony et al. Pending specification, claims, figures for U.S. Appl. No. 10/766,000, Claims 1-63; filed Jan. 29, 2004.
William Anthony Pending specification, claims, figures for U.S. Appl. No. 10/399,630, Claims 1-35; filed Aug. 27, 2003.
Anthony Anthony et al. Pending specification, claims, figures for U.S. Appl. No. 10/432,840, Claims 1-39; filed May 28, 2003.
William Anthony Pending specification, claims, figures for U.S. Appl. No. 10/443,482, Claims 1-25; filed Jun. 12, 2003.
Anthony Anthony et al. Pending specification, claims, figures for U.S. Appl. No. 10/435,199, Claims 1-32; filed May 12, 2003.
Anthony Anthony et al. Pending specification, claims, figures for U.S. Appl. No. 10/115,159, Claims 1-31; filed Apr. 2, 2002.
Anthony Anthony et al. Pending specification, claims, figures for U.S. Appl. No. 10/189,338, Claims 1-69; filed Jul. 2, 2002.
Anthony Anthony et al. Pending specification, claims, figures for U.S. Appl. No. 10/189,339, Claims 1-41; filed Jul. 2, 2002.
Anthony Anthony et al. Pending specification, claims, figures for U.S. Appl. No. 10/479,506, Claims 1-46; filed Dec. 10, 2003.
Anthony Anthony Pending specification, claims, figures for U.S. Appl. No. 10/443,764, Claims 26-40; filed Sep. 16, 2003.
Anthony Anthony Pending specification, claims, figures for U.S. Appl. No. 10/443,792, Claims 1-41; May 23, 2003.
Anthony Anthony Pending specification, claims, figures for U.S. Appl. No. 10/443,788, Claims 1; 21-45; filed May 23, 2003.
Anthony Anthony et al. Pending specification, claims, figures for U.S. Appl. No. 10/443,778, Claims 1; 21-59; filed May 23, 2003.
Anthony Anthony et al. Pending specification, claims, figures for U.S. Appl. No. 10/460,361, Claims 1-16; filed Jun. 13, 2003.
Anthony Anthony et al. Pending specification, claims, figures for U.S. Appl. No. 10/705,962, Claims 19-33; filed May 25, 2005.
Anthony Anthony Pending specification, claims, figures for U.S. Appl. No. 10/369,335, Claims 1-20; Feb. 18, 2003.
Anthony Anthony et al. Pending specification, claims, figures for U.S. Appl. No. 09/647,648, Claims 1-48; filed Nov. 17, 2000.
Anthony Anthony Pending specification, claims, figures for U.S. Appl. No. 10/328,942, Claims 1-20; filed Dec. 23, 2002.
Anthony Anthony et al. Pending specification, claims, figures for U.S. Appl. No. 09/632,048, Claims 1-20; filed Aug. 3, 2000.
Anthony Anthony et al. Pending specification, claims, figures for U.S. Appl. No. 09/996,355, Claims 1-73; filed Nov. 29, 2001.
Willian Anthony Pending specification, claims, figures for U.S. Appl. No. 10/023,467, Claims 1-20; filed Dec. 17, 2001.
Jan. 1, 2005, Weir, et al., "DesignCon 2005, High Performance FPGA Bypass Networks".
Apr. 25, 2002, Pending claims 1-40 and figures (3 pages) for U.S. Appl. No. 10/399,590; the specification is contained in WO 02/33798, filed Oct. 17, 2001, which is the published version of PCT/US01/32480.
Feb. 11, 2005 PCT International Search Report for PCT/US04/00218.
Feb. 18, 2005, PCT International Search Report for PCT/US04/14539.
Mar. 24, 2005, Australian Patent Office Examination Report for SG 200303041-8.
Apr. 11, 2005, PCT International Search Report for PCT/US04/18938.
Nov. 2000, Muccioli, "EMC Society Seattle and Oregon Chapters—New X2Y Filter Technology Emerges as Singles Component Solution for Noise Suppression".
Sep. 27, 2005, PCT Corrected IPER for PCT/US04/00218.
Nov. 8, 2005, Supplementary Partial European Search Report EP 99916477.
Oct. 27, 2005, Supplementary European Search Report EP 98915364.
Dec. 9, 2005, PCT ISR for PCT/US04/39777.
May 8, 2006, EP Examination Report for 99916477.5-2215.
Jul. 24, 2007, PCT Written Opinion of the International Search Authority PCT/US2007/063463.
Jul. 24, 2007, PCT International Search Report, PCT/US2007/063463.
Oct. 31, 2007, PCT International Search Report PCT/US06/06609.
Oct. 31, 2007, PCT Written Opinion of the International Search Authority PCT/US06/06609.
Oct. 31, 2007, PCT Written Opinion of the International Search.
Jun. 12, 2008, PCT International Search Report PCT/US06/06608.
Jun. 12, 2008, PCT Written Opinion of the International Search Authority PCT/US06/06608.
Jun. 12, 2008, PCT International Search Report PCT/US06/06607.
Jun. 12, 2008, PCT Written Opinion of the International Search Authority PCT/US06/06607.
Jun. 17, 2008, PCT International Search Report PCT/US06/08901.
Jun. 17, 2008, PCT Written Opinion of the International Search Authority PCT/US06/08901.
Jun. 6, 2008, European Search Report EP 07 01 9451.
Sep. 25, 2008, European Search Report EP 01 99 4116.
Sep. 25, 2008, European Search Report EP 01 99 9170.
Sep. 25, 2008, European Search Report EP 01 99 0677.
Sep. 18, 2008, PCT Written Opinion of the International Search Authority PCT/US07/063463.
Sep. 25, 2008, European Search Report EP 01 90 8876.
Sep. 25, 2008, European Search Report EP 01 92 2559.
Sep. 25, 2008, European Search Report EP 01 98 1731.
Jan. 24, 1995, Patent Abstracts of Japan, English translation of abstract for JP 07-022757.
Oct. 13, 2000, Patent Abstracts of Japan, English translation of abstract for JP 2000-28665.

* cited by examiner

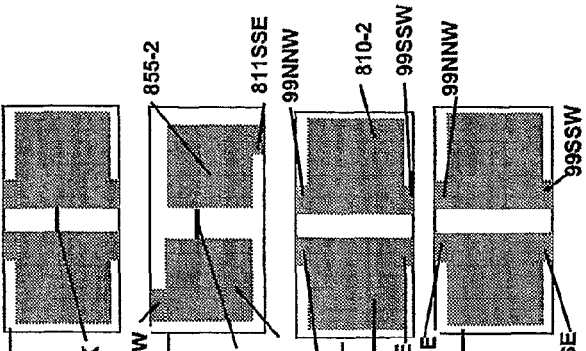
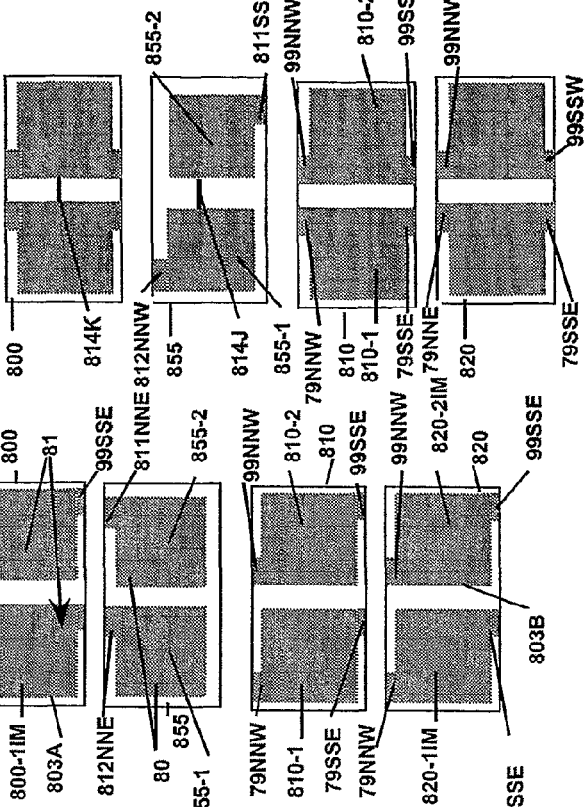
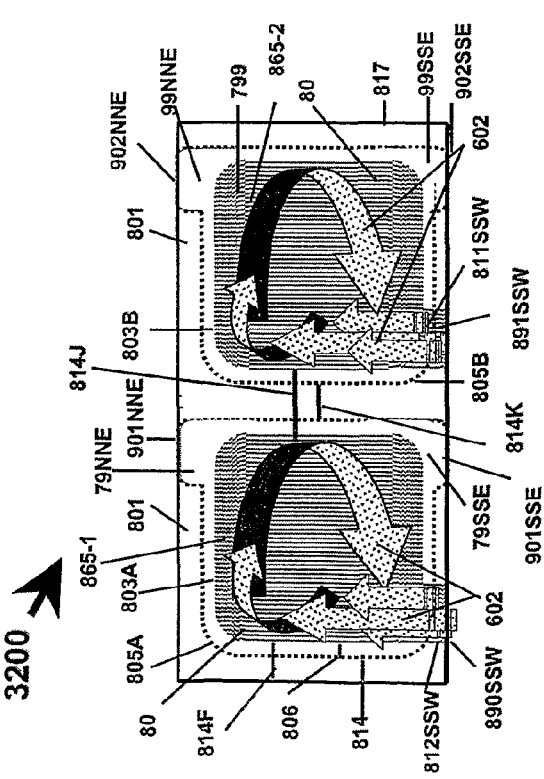
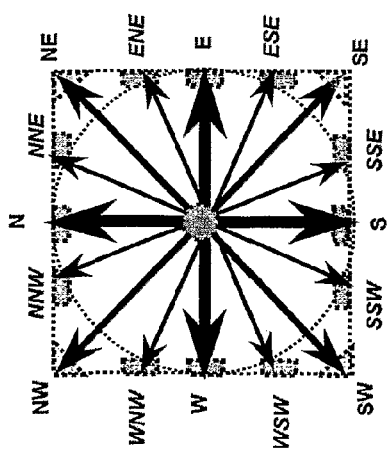

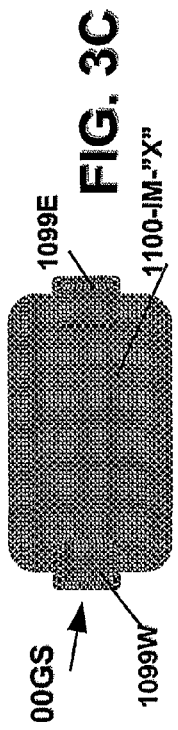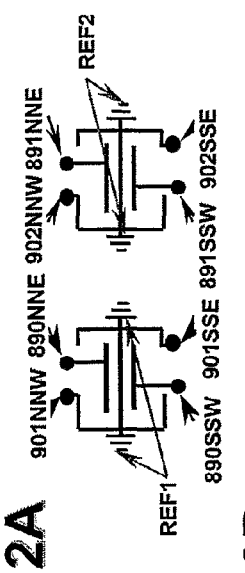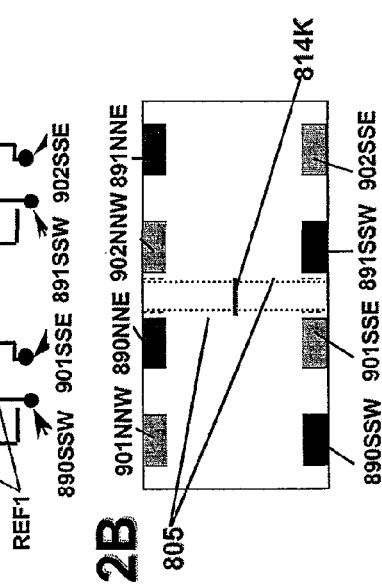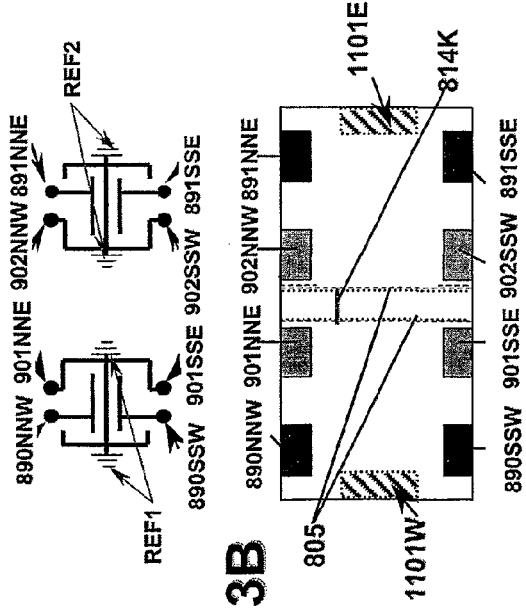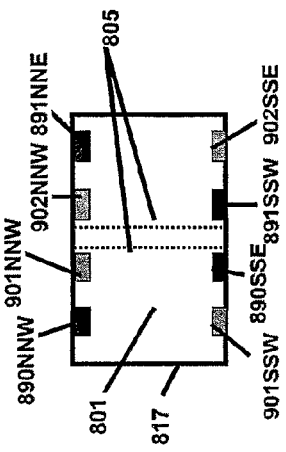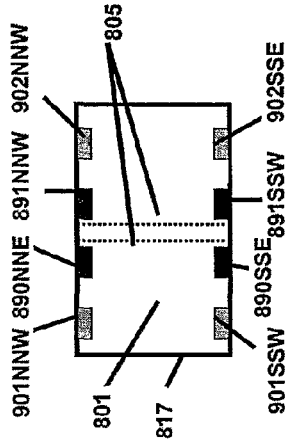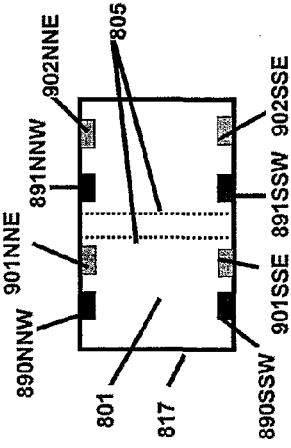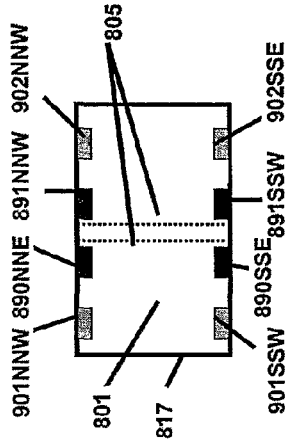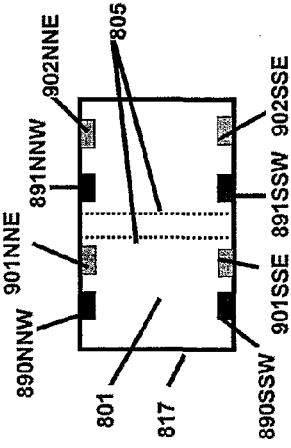

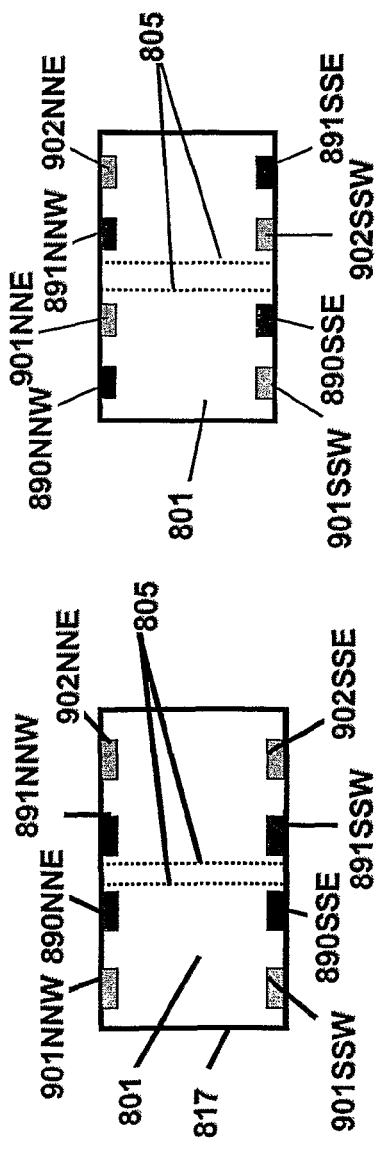
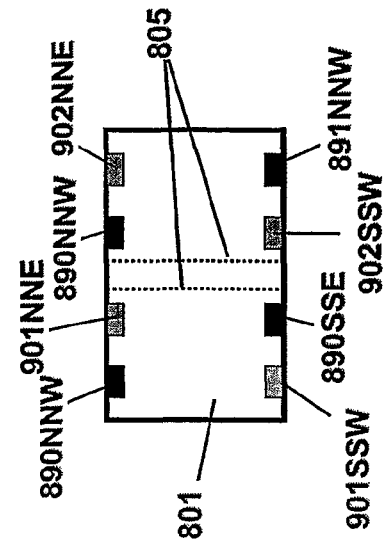
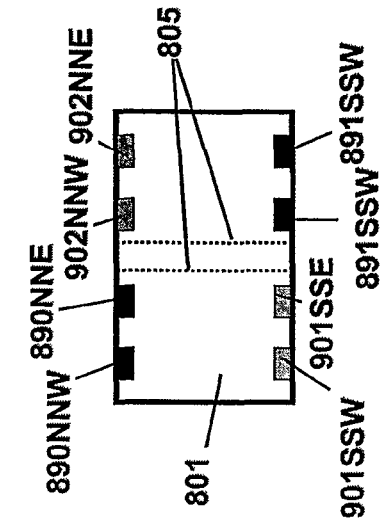
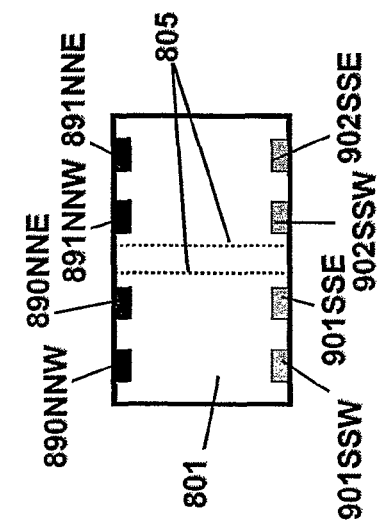
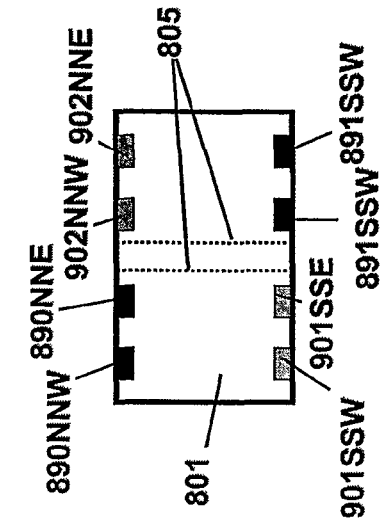
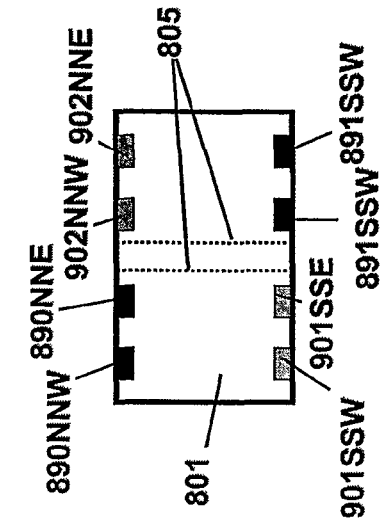

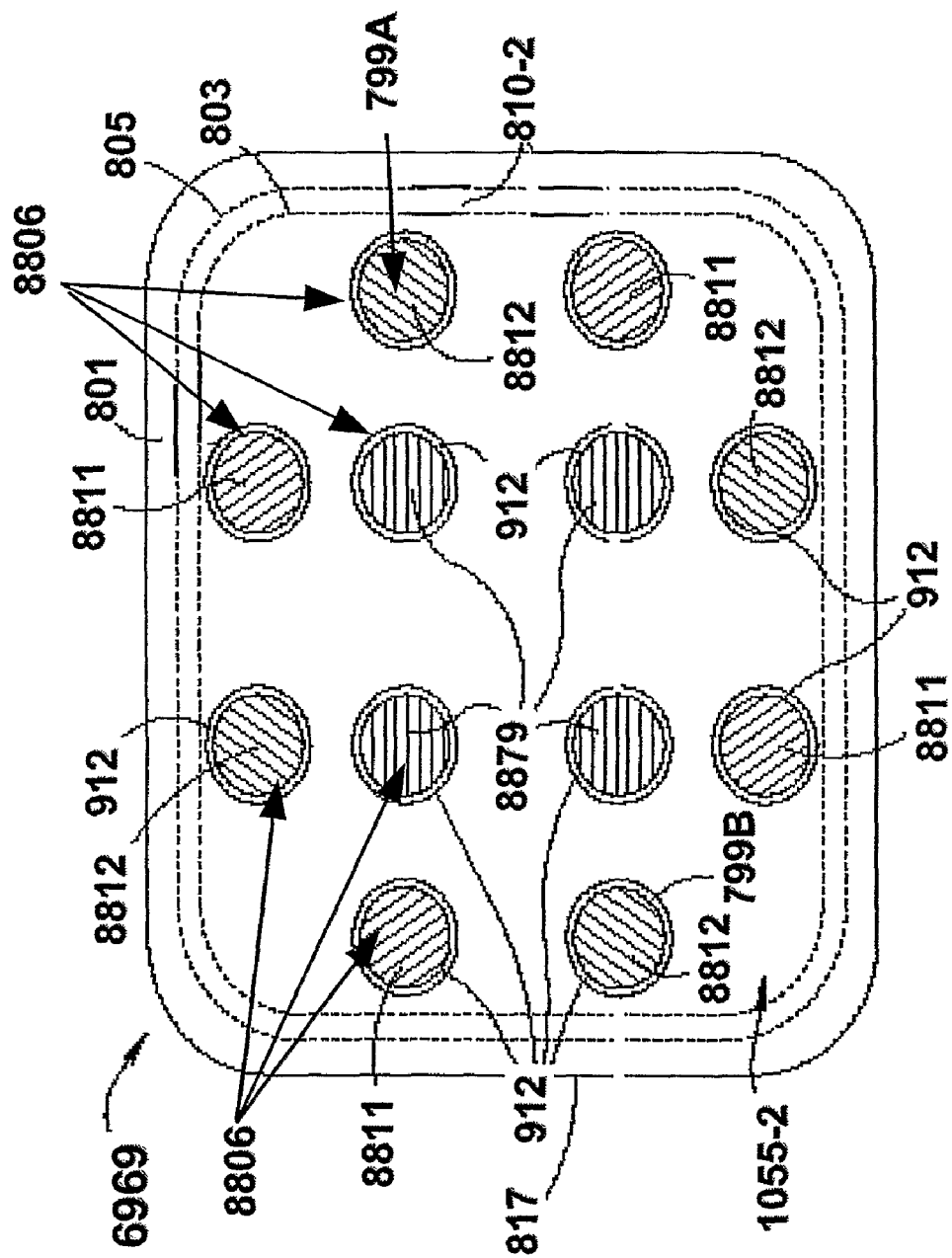

ARRANGEMENTS FOR ENERGY CONDITIONING

CROSS REFERENCE TO RELATED APPLICATIONS

This application is a continuation of application Ser. No. 10/479,506, filed Dec. 10, 2003, now issued as U.S. Pat. No. 7,336,468, which is a U.S. National Stage Application of International Application PCT/US02/21238, filed Jul. 2, 2002, which is a continuation-in-part of application Ser. No. 10/023,467, filed Dec. 17, 2001, now abandoned, which is a continuation-in-part of application Ser. No. 09/996,355, filed Nov. 29, 2001, now abandoned, which is a continuation-in-part of application Ser. No. 10/003,711, filed Nov. 15, 2001, now abandoned, which is a continuation-in-part of application Ser. No. 09/982,553, filed Oct. 17, 2001, now abandoned;

and this application is a continuation of application Ser. No. 10/479,506, filed Dec. 10, 2003, now issued as U.S. Pat. No. 7,336,468, which is a continuation-in-part of application Ser. No. 10/115,159, filed Apr. 2, 2002, now issued as U.S. Pat. No. 6,894,884, which is a continuation-in-part of application Ser. No. 09/845,680, filed Apr. 30, 2001, now issued as U.S. Pat. No. 6,580,595, which is a continuation-in-part of application Ser. No. 09/777,021, filed Feb. 5, 2001, now issued as U.S. Pat. No. 6,687,108, which is a continuation-in-part of application Ser. No. 09/632,048, filed Aug. 3, 2000, now issued as U.S. Pat. No. 6,738,249, which is a continuation-in-part of application Ser. No. 09/594,447, filed Jun. 15, 2000, now issued as U.S. Pat. No. 6,636,406, which is a continuation-in-part of application Ser. No. 09/579,606, filed May 26, 2000, now issued as U.S. Pat. No. 6,373,673, which is a continuation-in-part of application Ser. No. 09/460,218, filed Dec. 13, 1999, now issued as U.S. Pat. No. 6,331,926, which is a continuation of application Ser. No. 09/056,379, filed Apr. 7, 1998, now issued as U.S. Pat. No. 6,018,448, which is a continuation-in-part of application Ser. No. 09/008,769, filed Jan. 19, 1998, now issued as U.S. Pat. No. 6,097,581, which is a continuation-in-part of application Ser. No. 08/841,940, filed Apr. 8, 1997, now issued as U.S. Pat. No. 5,909,350;

and application Ser. No. 10/115,159 claims the benefit of provisional Application No. 60/280,819, filed Apr. 2, 2001, provisional Application No. 60/302,429, filed Jul. 2, 2001, provisional Application No. 60/310,962, filed Aug. 8, 2001;

and application Ser. No. 09/845,680 claims the benefit of provisional Application No. 60/200,327, filed Apr. 28, 2000, provisional Application No. 60/215,314, filed Jun. 30, 2000, provisional Application No. 60/225,497, filed Aug. 15, 2000, provisional Application No. 60/255,818, filed Dec. 15, 2000;

and application Ser. No. 09/777,021 claims the benefit of provisional Application No. 60/180,101, filed Feb. 3, 2000, provisional Application No. 60/185,320, filed Feb. 28, 2000, provisional Application No. 60/191,196, filed Mar. 22, 2000, provisional Application No. 60/200,327, filed Apr. 28, 2000, provisional Application No. 60/203,863, filed May 12, 2000, provisional Application No. 60/215,314, filed Jun. 30, 2000, provisional Application No. 60/225,497, filed Aug. 15, 2000, provisional Application No. 60/241,128, filed Oct. 17, 2000, provisional Application No. 60/248,914, filed Nov. 15, 2000, provisional Application No. 60/252,766, filed Nov. 22, 2000, provisional Application No. 60/253,793, filed Nov. 29, 2000, provisional Application 60/255,818, filed Dec. 15, 2000;

and application Ser. No. 09/632,048 claims the benefit of provisional Application No. 60/146,987, filed Aug. 3, 1999, provisional Application No. 60/165,035, filed Nov. 12, 1999, provisional Application No. 60/180,101, filed Feb. 3, 2000, provisional Application No. 60/185,320, filed Feb. 28, 2000, provisional Application No. 60/191,196, filed Mar. 22, 2000, provisional Application No. 60/200,327, filed Apr. 28, 2000, provisional Application No. 60/203,863, filed May 12, 2000, provisional Application No. 60/215,314, filed Jun. 30, 2000;

and application Ser. No. 09/594,447 claims the benefit of provisional Application No. 60/139,182, filed Jun. 15, 1999, provisional Application No. 60/146,987, filed Aug. 3, 1999, provisional Application No. 60/165,035, filed Nov. 12, 1999, provisional Application No. 60/180,101, filed Feb. 3, 2000, provisional Application No. 60/185,320, filed Feb. 28, 2000, provisional Application No. 60/191,196, filed Mar. 22, 2000, provisional Application No. 60/200,327, filed Apr. 28, 2000, provisional Application No. 60/203,863, filed May 12, 2000;

and application Ser. No. 09/579,606 claims the benefit of provisional Application No. 60/136,451, filed May 28, 1999, provisional Application No. 60/139,182, filed Jun. 15, 1999, provisional Application No. 60/146,987, filed Aug. 3, 1999, provisional Application No. 60/165,035, filed Nov. 12, 1999, provisional Application No. 60/180,101, filed Feb. 3, 2000, provisional Application No. 60/185,320, filed Feb. 28, 2000, provisional Application No. 60/200,327, filed Apr. 28, 2000, provisional Application No. 60/203,863, filed May 12, 2000;

and application Ser. No. 10/023,467 claims the benefit of provisional Application No. 60/255,818, filed Dec. 15, 2000, provisional Application No. 60/280,819, filed Apr. 2, 2001, provisional Application No. 60/302,429, filed Jul. 2, 2001, provisional Application No. 60/310,962, filed Aug. 8, 2001;

and application Ser. No. 09/982,553 claims the benefit of provisional Application No. 60/241,128, filed Oct. 17, 2000;

and application Ser. No. 09/996,355 claims the benefit of provisional Application No. 60/253,793, filed Nov. 29, 2000, provisional Application No. 60/255,818, filed Dec. 15, 2000, provisional Application No. 60/280,819, filed Apr. 2, 2001, provisional Application No. 60/302,429, filed Jul. 2, 2001, provisional Application No. 60/310,962, filed Aug. 8, 2001;

and application Ser. No. 10/003,711 claims the benefit of provisional Application No. 60/248,914, filed Nov. 15, 2000, provisional Application No. 60/252,766, filed Nov. 22, 2000, provisional Application No. 60/253,793, filed Nov. 29, 2000, provisional Application No. 60/255,818, filed Dec. 15, 2000, provisional Application No. 60/280,819, filed Apr. 2, 2001, provisional Application No. 60/302,429, filed Jul. 2, 2001, and provisional Application No. 60/310,962, filed Aug. 8, 2001;

and PCT application No. PCT/US02/21238 claims the benefit under 35 U.S.C. 119(e) of provisional Application No. 60/302,429, filed Jul. 2, 2001, provisional Application No. 60/310,962, filed Aug. 8, 2001, provisional Application No. 60/388,388, filed Jun. 12, 2002.

This application incorporates by reference the disclosure of the parent application Ser. No. 10/479,506, which is a U.S. national stage entry of PCT application No. PCT/US02/21238, filed Jul. 2, 2002, which is continuation-in-part of pending application Ser. No. 10/023,467, filed Dec. 17, 2001, which is a continuation-in-part of co-pending application Ser. No. 09/996,355, filed Nov. 29, 2001, which is a continuation-in-part of co-pending application Ser. No. 10/003,711, filed Nov. 17, 2001, which is a continuation-in-part of co-pending application Ser. No. 09/982,553, filed Oct. 17, 2001, each of which is incorporated by reference herein.

In addition, parent application Ser. No. 10/479,506 claims the benefit of provisional Application No. 60/302,429, filed Jul. 2, 2001, provisional Application No. 60/310,962, filed Aug. 8, 2001, provisional Application No. 60/349,954, filed Jan. 8, 2002, and provisional Application No. 60/388,388, filed Jun. 12, 2002, each of which is incorporated by reference herein.

TECHNICAL FIELD

This application relates to balanced shielding arrangements that use complementary relative groupings of energy pathways, such as pathways for various energy propagations for multiple energy conditioning functions. These shielding arrangements may be operable as discrete or non-discrete embodiments that can sustain and condition electrically complementary energy confluences.

BACKGROUND OF THE INVENTION

Today, as the density of electronics within applications increases, unwanted noise byproducts of the increased density may limit the performance electronic circuitry.

Consequently, the avoidance of the effects of unwanted noise byproducts, such as by isolation or immunization of circuits against the effects of the undesirable noise is an important consideration for circuit arrangements and circuit design.

Differential and common mode noise energy may be generated by, and may propagate along or around, energy pathways, cables, circuit board tracks or traces, high-speed transmission lines, and/or bus line pathways. These energy conductors may act as, for example, an antenna that radiates energy fields. This antenna-analogous performance may exacerbate the noise problem in that, at higher frequencies, propagating energy utilizing prior art passive devices may experience increased levels of energy parasitic interference, such as various capacitive and/or inductive parasitics.

These increases may be due, in part, to the combination of constraints resulting from functionally or structurally limitations of prior art solutions, coupled with the inherent manufacturing or design imbalances and performance deficiencies of the prior art. These deficiencies inherently create, or induce, unwanted and unbalanced interference energy that may couple into associated electrical circuitry, thereby making at least partial shielding from these parasitics and electromagnetic interference desirable. Consequently, for broad frequency operating environments, solving these problems necessitates at least a combination of simultaneous filtration, careful systems layout having various grounding or anti-noise arrangements, as well as extensive isolating in combination with at least partial electrostatic and electromagnetic shielding.

BRIEF SUMMARY OF THE INVENTION

Thus, a need. exists for a self-contained, energy-conditioning arrangement utilizing simplified energy pathway arrangements, which may additionally include other elements, amalgamated into a discreet or non-discreet component, which may be utilized in almost any circuit application for providing effective, symmetrically balanced, and sustainable, simultaneous energy conditioning functions selected from at least a decoupling function, transient suppression function, noise cancellation function, energy blocking function, and energy suppression functions.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts and in which:

FIG. 1 is a relative location compass operable for determining relative locations of the various pathway extensions disclosed;

FIGS. 1A-1C show relative locations of the various pathway extensions disclosed according to an aspect of the present invention;

FIG. 2A shows a circuit schematic of the plan view of an embodiment of 2B according to an aspect of the resent invention;

FIG. 2B is a plan view of an embodiment according to an aspect of the present invention;

FIG. 3A shows a circuit schematic of the plan view of an embodiment of 3B according to an aspect of the present invention;

FIG. 3B is a plan view of an embodiment according to an aspect of the present invention; FIG. 3C shows a plan view of a shield according to an aspect of the present invention;

FIG. 4A shows a relative plan view of an embodiment according to an aspect of the present invention;

FIG. 4B shows a relative plan view of an embodiment according to an aspect of the present invention;

FIG. 4C shows a relative plan view of an embodiment according to an aspect of the present invention;

FIG. 4D shows a relative plan view of an embodiment according to an aspect of the present invention;

FIG. 4E shows a relative plan view of an embodiment according to an aspect of the present invention;

FIG. 4F shows a relative plan view of an embodiment according to an aspect of the present invention;

FIG. 4G shows a relative plan view of an embodiment according to an aspect of the present invention;

FIG. 4H shows a relative plan view of an embodiment according to an aspect of the present invention;

FIG. 4I shows a relative plan view of an embodiment according to an aspect of the present invention;

FIG. 5C shows a relative plan view of a stacked multiple, non-shared circuit network having VIAs including groups of pathways according to an aspect of the present invention;

DETAILED DESCRIPTION OF THE INVENTION

Figure 5B:
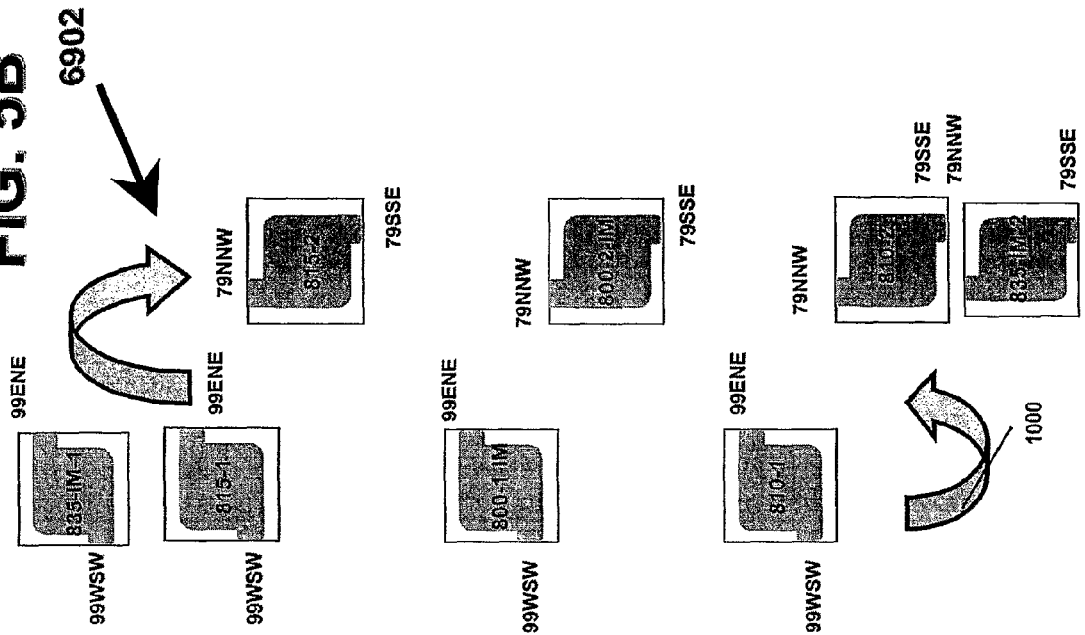
FIG. 5B shows a stacked shield according to an aspect of the present invention.

It is to be understood that the figures and descriptions of the present invention have been simplified to illustrate elements that are relevant for a clear understanding of the present invention, while eliminating, for the purpose of clarity, many other elements found in typical energy conditioning systems and methods. Those of ordinary skill in the art will recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Additionally, it will be apparent to those skilled in the art that terms used herein that may include a whole, or a portion of a whole, such as "energy", "system", circuit, and the like, are contemplated to include both the portions of the whole, and the entire of the whole, as used, unless otherwise noted.

As used herein, an "energy pathway" or "pathway" may be at least one, or a number, of conductive materials, each one operable for sustained propagation of energy. Pathways may be conductive, thereby better propagating various electrical energies as compared to non-conductive or semi-conductive materials directly or indirectly coupled to, or adjacent to, the pathways. An energy pathway may facilitate propagation of a first energy by allowing for various energy conditioning functions, such as conditioning functions arising due to any one or a number of aspects, such as, but not limited to, the shielding, the orientation and/or the positioning of the energy pathways within the energy pathway arrangement, which various arrangements having an orientation and/or positioning thereby allow for interaction of the first energy with propagating energies that are complementary to at least the first energy. An energy pathway may include an energy pathway portion, an entire energy pathway, a conductor, an energy conductor, an electrode, at least one process-created conductor, and/or a shield. A plurality of energy pathways may include a plurality of each device or element discussed hereinabove with respect to energy pathway. Further, as used generally herein, a conductor may include, for example, an individual conductive material portion, a conductive plane, a conductive pathway, a pathway, an electrical wire, a via, an aperture, a conductive portion such as a resistive lead, a conductive material portion, or an electrical plate, such as plates separated by at least one medium 801, for example.

A shield may include a shielding electrode, a shielding pathway portion, a shielded pathway, a shielded conductor, a shielded energy conductor, a shielded electrode, and/or at least one process-created shielded pathway portion. A plurality of shields may include a plurality of the devices discussed hereinabove with respect to a shield.

As used generally herein, a pathway may be complementary positioned, or complementary orientated, with respect to a main-body 80,81, having various pathway extensions, designated 79"X", 812"X", 811"X" and 99"X". Main-bodies 80,81 may be in three-dimensional physical relationships individually, in pairs, groups, and/or pluralities as to distance, orientation, position, superposition, non-superposition, alignment, partial alignment, lapping, non-lapping, and partial lapping. Superposed main-body pathway 80, may, for example include a pairing of physically opposing and oppositely orientated main-body pathways 80 that are any one of, or any combination of, electrically null, electrically complementary, electrically differential, or electrically opposite.

A pathway arrangement may include at least a shield at least partially shielding at least one energy pathway, or a group of shields forming a shield structure that at least partially shielding, via a conductive shielding, at least a conductively isolated pairing of at least two energy pathways, such as vias, apertures or complementary paired pathways.

An exemplary embodiment may allow energy propagation on a conductively isolated pairing, such as complementary paired pathways, causing energy propagation on common shields, or at least one grouping of shields, serving an isolated circuit. This embodiment may allow a low inductance pathway to form among at least a single pair of isolated and separate parallel pathways serving at least one separate and distinct isolated circuit system. An exemplary embodiment may allow for the development of at least a low inductance pathway for utilization of energy propagating on at least one parallel pathway of at least two sets of isolated and separate parallel pathways and the development along at least one parallel pathway of at least one other low inductance pathway for utilization of energy propagating along at least one other separate and distinct isolated circuit system.

An exemplary embodiment utilized as part of a circuit assembly may have at least one pathway of relatively lower inductance, while other pathways may be electrically coupled to an energy source or an energy load. A pathway of a second plurality of pathways may have a lower impedance operable for portions of energy to be taken away from either of the same at least one energy source or at least one energy load of the circuit assembly. This same pathway of low impedance may not be electrically directly coupled to either the same at least one energy source or at least one energy load of the circuit assembly as the one pathway of lower inductance. A system may have both a pathway of least inductance and a pathway of least impedance which are not the same pathway.

In contrast to capacitors found in the industry wherein an equivalent series inductance (ESL) of a capacitor device is normally size dependant, in the present invention the pathway of least impedance and the pathway of least inductance for a circuit for energy conditioning may be achieved independent of the physical size of the device. These aspects depend on a predetermined capacitance developed by a predetermined layers in the present invention.

Arranging the pathways allows the resistance of the conductive material of the pathways to primarily determine the energy delivery, or relative efficiency or effect between at least one source of energy and one energy utilizing load of an integrated circuit, for example.

The ESL may be a negligible factor, rather than a primary factor for delivery outcome or decoupling void of debilitating inductances.

In an illustrative pathway arrangement illustrated in FIGS. 1A, 1B, 1C, 5A and 5B, wherein the various propagating energies may be complementary, the pathway arrangement, upon placement into a circuit arrangement, may allow for energy propagation within or along certain energy pathways of the pathway arrangement, thereby allowing for the mutual interaction of opposite portions of pathway-soured magnetic fields produced by the propagation of energy field currents emanating outwardly from each set of the complementary conductors. This mutual interaction maybe a mutual cancellation in embodiments wherein certain pathways may be partially or totally physically shielded from other complementary pathways, and may be placed within an influencing distance of those other complementary pathways. Further, a substantial similarity in size and shape of the respective complementary pathways, including the spaced-apart relationship and the interpositioning of a shielding between pathways, and the conductively isolated relationship of the pathways, may contribute to this mutual cancellation effect. Additionally, the shielding operations may be predicated on a relative positioning of a mating of the paired pathways relative to the conductive electrostatic shielding. At least the complementary energy conditioning functions and electrostatic shielding dynamics discussed herein may operate on various energy propagating in various directions along various predetermined pathways, and may operate on circuits having dynamic operation utilizing the pathway arrangement.

A sub-combination of electromagnetically/electrostatically actuated impedance states may develop along or within a pathway arrangement, or along or within a closely coupled external conductive portion conductively coupled to separate or multiple groupings of shields, to thereby form an energy conditioning circuit. These electromagnetically/electrostatically actuated impedance states may develop, for example, because of the energization of one paired set of pathways of one circuit portion, but not necessarily develop on another paired set of pathways from another circuit portion, for example.

According to an aspect of the present invention, each shield may include a main-body 81. Main-bodies 81 may collectively and conductively couple to one another and at the same time may substantially immure and shield the main-body 80 of the energy pathways. In other embodiments of the present invention, the collective shielding main-body 81 may only partially immure or shield the pathway main-body 80s in at least one portion of the shielding.

According to an aspect of the present invention, a balanced, symmetrical, pathway arrangement may result from the symmetry of certain superposed shields, from complementary pathway sizing and shaping, and/or from reciprocal positioning and pairing of the complementary pathways. Manufacturable balanced or symmetrical physical arrangements of pathways, wherein dynamic energy propagation, interactions, pairings or match-ups of various dynamic quantities occur, may operate at less than a fundamental limit of accuracy of testing equipment. Thus, when portions of these complementary energy quantities interact simultaneously, the energy may be beyond the quantifiable range of the typical testing equipment. Thus, the extent to which the measurement may be obtained may employ increased controllability, and thereby the electrical characteristics and the effect on electrical characteristics may be controlled, such as by predetermining the desired measurability, behavior or enhancement to be provided, and by a correspondent arrangement of the elements, such as specifically by an arrangement of the elements to provide the desired measurability or effect. For example, a desired electrical characteristic may be predetermined for a desired enhancement by varying at least a portion of the complementary balance, size, shape, and symmetry of at least one pathway paring, as set forth herein below and as illustrated in FIGS. 1A, 1B, 1 C, 5A and 5B, for example.

Thus, the extent of energy interactions, mutual energy propagation timings and interferences, for example, may be controlled by tolerances within the pathway arrangement.

A manufacturing process, or computer tolerance control, such as semiconductor process control, may control these tolerances, for example. Thus, the pathways of an embodiment may be formed using manufacturing processes, such as passive device processes, apparent to those skilled in the art. Mutual energy propagation measurements may thereby be cancelled or suppressed by the formation, and process of formation, of the pathway arrangement.

A pathway arrangement may, as set forth hereinabove, include a sequentially positioned grouping of pathways in an amalgamated electronic structure having balanced groupings of pathways. The balanced grouping may include a predetermined pathway architecture having a stacked hierarchy of pathways that are symmetrical and complementary in number, and that are positioned complementary to one another, thereby forming pairs, each of which pair is substantially equidistant from each side of a centrally positioned shield, wherein each shield may provide a symmetrical balancing point for both each pair pathway and the overall pathway hierarchy as depicted in FIGS. 1A to 4I, for example. Thus, predetermined identically sized, shaped and complementary positioned pathways may be present on either side of a centrally positioned shield for each separate circuit portion. A total circuit may have its complementary portions symmetrically divided into a complementary physical format including a reverse-mirror image positioning of paired shielded, complementary sized and shaped pathways, sandwiching at least one interposing shield.

According to an aspect of the present invention, each pathway may be, for example, a first interconnect substrate wrapping around, or holding, an integrated circuit wafer, a deposit, an etching, or a resultant of a doping process, and the shield may be, for example, a pathway substrate, an energy conditioning embodiment or energy conditioning substrate, a deposit, an etching, a resultant of a doping process, and may have, for example, resistive properties.

Additional elements may be utilized, including conductive and nonconductive elements, between the various pathways. These additional elements may take the form of ferromagnetic materials or ferromagnetic-like dielectric layers, and/or inductive-ferrite dielectric derivative materials. Additional pathway structural elements may be utilized, including conductive and nonconductive multiple pathways of different conductive material compositions, conductive magnetic field-influencing material hybrids and conductive polymer sheets, various processed conductive and nonconductive laminates, straight conductive deposits, multiple shielding pathway pathways utilizing various types of magnetic material shields and selective shielding, and conductively doped and conductively deposited on the materials and termination solder, for example, in addition to various combinations of material and structural elements, to provide a host of energy conditioning options.

Non-conductor materials may also provide structural support of the various pathways, and these non-conductor materials may aid the overall energized circuit in maintaining the simultaneous, constant and uninterrupted energy propagation moving along the pathways.

Dielectric materials for example, may include one or more layers of material elements compatible with available processing technology. These dielectric materials may be a semiconductor material such as silicon, germanium, gallium arsenide, or a semi-insulating and insulating material such as, but not limited to any K, high K and low K dielectrics.

Pathway and conductor materials may be selected from a group consisting of Ag, Ag/Pd, Cu, Ni, Pt, Au, Pd and other such conductive materials and metals. Combinations of these metal materials are suitable for the purposes discussed herein, and may include appropriate metal oxides, such as ruthenium oxide, which, depending on the exigencies of a particular application, may be diluted with a suitable metal. Other pathways may be formed of a substantially non-resistive conductive material. Any substances and processes that may create pathways from conductive, non-conductive, semi-conductive material, and/or Mylar films printed circuit board materials, or any substances or processes that may create conductive areas such as doped polysilicons, sintered polycrystallines, metals, polysilicon silicates, or polysilicon silicide may be used within or with the pathway arrangement.

An exemplary embodiment of the present invention may utilize an internal shield structural architecture to insure energy balancing configurations within the various arrangements, rather than a specific external circuit balance. This balancing configuration is dependent upon the relative positioning of all the shields in relationship to the shared and centrally positioned shield, and the actual paired shields positioned in specific quantities, to simultaneously provide shielding for the electrically opposing shielded paired pathways utilized by propagating energy. This allows these electrically opposing complementary pathways to be located both electrically and physically on the opposite sides of the centrally positioned and shared common conductive shield. This interposition of the central and shared shields may create a voltage divider that divides various circuit voltages in half and that provides, to each of the oppositely paired shielded conductors, one half of the voltage energy normally expected. The energized circuitry, including shielded conductors, may be balanced electrically or in a charge-opposing manner and with respect to a centrally positioned shield, to a common and shared pathway, or to each respective, isolated circuit system portion.

Each common circuit member of an isolated circuit system may be attached or coupled to a common area or common pathway, thereby providing an external common zero voltage.

Thus, the embodiment may have multiple sets of shields electrically or physically located between at least one of the various electrically or charge opposing, shielded pairs or grouped complementary pairs of pathways in an interposed shielding relationship, supported with additional outer sandwiching shields, designated herein as-IM that are additionally coupled and, in part, form the shielding structure.

An exemplary embodiment may also be placed into one or more energy circuits that utilize different energy sources and that may supply one or more separate and distinct energy-utilizing loads. When energized for multiple energy conditioning operations and for providing simultaneous and effective energy conditioning functions, such as electromagnetic interference filtering, suppression, energy decoupling and energy surge protection, each separate and distinct circuit is utilizing the multiple commonly shared universal shield structure and circuit reference image, or node.

According to an aspect of the present invention, energy-conditioning functions may maintain an apparent balanced energy voltage reference and energy supply for each respective energy-utilizing load within a circuit. This energized arrangement may allow for specific energy propagation utilizing a single, or multiple, isolated pathway arrangement, and may not require balancing on a single, centralized shield. A shield may be physically and electrically located between one or multiple energy sources and one or multiple energy utilizing loads, depending upon the number of separate and isolated pathways. Thus shielding relative, centralized pathways may be in both co-planar and stacked variants of exemplary embodiment.

When the internally positioned paired shielded pathways are subsequently attached, or conductively coupled, to externally manufactured pathways, the internally positioned paired shields may be substantially enveloped within the cage-like shield structure, thereby minimizing internally generated energy strays and parasitics that may normally escape or couple to an adjacent shielded pathway. These shielding modes utilize propagating energy to the various pathways and may be separate of the electrostatic shield effect created by the energization of the shield structure. The propagating energy propagating in a complementary manner provides energy fields of mutually opposed, mutually cancelled fields as a result of the close proximity of opposite propagation. The complementary and paired pathways may provide an internally balanced opposing resistance load function.

A device according to an aspect of the present invention may mimic the functionality of at least one electrostatically shielded transformer. Transformers may be widely used to provide common mode isolation dependent upon a differential mode transfer across the inputs in order to magnetically link the primary windings to the secondary windings to transfer energy. As a result, common mode voltage across the primary winding is rejected. One flaw inherent in the manufacturing of transformers is the propagating energy source capacitance between the primary and secondary windings. As the frequency of the circuit increases, so does capacitive coupling, until circuit isolation may be compromised. If enough parasitic capacitance exists, high frequency RF energy may pass through the transformer and cause an upset in the circuits on the other side of the isolation gap subjected to the transient event.

A shield may be provided between the primary and secondary windings by coupling to a common pathway reference source designed to prevent capacitive coupling between the multiple sets of windings. A device according to an aspect of the present invention improves upon, and reduces the need for, transformers in circuits. The device may use a physical and relative, common pathway shield to suppress parasitics and also may use relative positioning of common pathway shields, a complementary paired pathway layering, the various couplings of the pathway layering, and an external conductive coupling to a conductive area per isolated circuit system, in combination with the various external circuitry, to effectively function as a transformer. If an isolated circuit system is upset by transients, the electrostatically shielded, transformer function of the device discussed herein may be effective for transient suppression and protection, and may simultaneously operate as a combined differential mode and common mode filter. Each set of relative shields and relative conductors may be conductively coupled to at least the same external pathway to provide a transformer functionality for example, Propagated electromagnetic interference may be the product of both electric and magnetic fields. A device according to an aspect of the present invention may be capable of conditioning energy that uses DC, AC, and AC/DC hybrid-type propagation, including conditioning energy in systems that may contain different types of energy propagation formats and in systems that may contain more than one circuit propagation characteristic.

In an exemplary embodiment, perimeter conductive coupling material for coupling or connecting, by conductive joining, of external portions of a typical embodiment into an assembly may be accomplished by conductive or non-conductive attachments to various types of angled, parallel or perpendicular, as those terms apply relative to at least another pathway, conductors known as apertures or blind or non-blind VlAs, passing through, or almost through, portions respectively of an exemplary embodiment. Couplings to at least one or more load (s), such as a portion of an integrated circuit, for one aspect of the invention may involve a selective coupling, or not, to these various types of conductors, such as apertures and V!As.

Fabricating a pathway may include forming one or more plated through hole (PTH) via (s) through one or more levels of a pathway. Electronic packages commonly include multiple interconnect levels. In such a package, the invention may include layering of patterned conductive material on one interconnect level that may be electrically insulated from patterned conductive material on another interconnect level, such as by dielectric material layers.

Connections or couplings between the conductive material at the various interconnect levels may be made by forming openings, referred to herein as vias or apertures, in the insulating portions or layers, that in turn can provide an electrically conductive structure such that the patterned or shaped conductive material portions or pathways from different levels are brought into electrical contact with each other. These structures can extend through one or more of the interconnect levels. Use of conductive, non-conductive or conductively-filled apertures and VlAs allows propagating energy to transverse an exemplary embodiment as if utilizing a by-pass or feed-through pathway configuration of an embodiment. An embodiment may serve as a support, a system or a subsystem platform that may contain both or either active and passive components layered to provide the benefits described for conditioning propagated energy between at least one source and at least one load.

An aspect of the present invention may provide a conductive architecture or structure suitable for inclusion in a packaging or an integrated circuit package having other elements.

Other elements may be directly coupled to the device for simultaneous physical and electrical shielding by allowing simultaneous energy interactions to take place between grouped and energized complementary conductors that are fed by other pathways. Typical capacitive balances found between at least one shielding pathway may be found when measuring opposite sides of the shared shield structure per isolated circuit, and may be maintained at measured capacitive levels within this isolated circuit portion, even with the use of common non-specialized dielectrics or pathway conductive materials. Thus, complementary capacitive balancing, or tolerance balancing characteristics, of this type of electrical circuit due to element positioning, size, separations and attachment positioning allow an exemplary embodiment having an isolated circuit system manufactured at 3% capacitive tolerance, internally, to pass to a conductively coupled and energized isolated circuit system a maintained and correlated 3% capacitive tolerance between electrically opposing and paired complementary pathways of each respective isolated circuit system, with respect to the dividing shield structures placed into the isolated circuit system.

An exemplary embodiment may allow utilization of relatively inexpensive dielectrics, conductive materials and various other material elements in a wide variety of ways. Due to the nature of the architecture, the physical and electrical dividing structure created may allow the voltage dividing and balancing among the grouped, adjacent elements, and may allow for the minimization of the effect of material hysteresis and piezoelectric phenomenon to such a degree that propagating energy normally disrupted or lost to these effects may be essentially retained in the form of active component switching response time, as well as instantaneous ability to appear to the various energy-utilizing loads as an apparent open energy flow simultaneously on both electrical sides of a pathway connecting or coupling from an energy source to a respective load, and from the load back to the source.

A structured layer may be shaped, buried within, enveloped by, or inserted into various electrical systems and subsystems to perform line conditioning or decoupling, for example, and to aid in or to allow for a modifying of an electrical transmission of energy to a desired or predetermined electrical characteristic. Expensive, specialized, dielectric materials that attempt to maintain specific or narrow energy conditioning or voltage balancing may no longer be needed for bypass, feed through, or energy decoupling operations for a circuit.

A device according to an aspect of the present invention may, as set forth hereinabove, be placed between each isolated circuit and a paired plurality of pathways or differential pathways. This exemplary device may operate effectively across a broad frequency range, as compared to a single discrete capacitor or inductor component, and may continue to perform effectively within an isolated circuit system operating beyond, for example, a GHz.

As set forth hereinabove, the exemplary device may perform shielding functions in this broad frequency range. A physical shielding of paired, electrically opposing and adjacent complementary pathways may result from the size of the common pathways in relationship to the size of the complementary pathways, and from the energized, electrostatic suppression or minimization of parasitics originating from the sandwiched complementary conductors and preventing external parasitics. Further, the positioning of the shielding, relative to shielding that is more conductive, may be used to protect against inductive energy and "H-Field" coupling. This technique is known as mutual inductive cancellation.

Parasitic coupling is known as electric field coupling. The shielding function discussed hereinabove provides primary shielding of the various shielded pathways electrostatically against electric field parasitics. Parasitic coupling involving the passage of interfering propagating energy because of mutual or stray parasitic energy originating from the complementary conductor pathways may be thereby suppressed. A device according to an aspect of the present invention may, for example, block capacitive coupling by enveloping. oppositely phased conductors in the universal shield architecture with stacked conductive hierarchical progression thereby providing an electrostatic or Faraday shield effect with respect to the pathway positioning as to the respective layering and position, both vertically and horizontally, of the pathways. The shielding pathway architecture may be used to suppress and prevent internal and external parasitic coupling between potentially noisy conductors and victim conductors, such as by an imposition of a number of common pathway layers that are larger than the smaller paired complementary pathways, but that are positioned between each of the complementary pathway conductor pairs to suppress and to contain the stray parasitics.

Further, as set forth hereinabove, positioning of the shielding, relative to shielding that is more conductive, may be used against inductive energy and "H-Field" coupling. This cancellation is accomplished by physically shielding energy, while simultaneously using a complementary and paired pathway positioned to allow for the insetting of the contained and paired complementary pathways within an area size correspondent to the shield size. A device according to an aspect of the present invention is adapted to use shields separately as internal shields or groupings, thereby substantially isolating and sandwiching pairs of electrically opposing complementary pathways, and thereby providing a physically tight or minimized energy and circuit loop propagation path between each shield and the active load.

Close proximity of shields and non-shields may allow energy along shields even if a direct electrical isolation exists because of 801 material type or the spacing.

Flux cancellation of propagating energy along paired and electrically opposing or differential pathways may result from spacing of pathways apart by a very small distance for oppositely phased electrically complementary operations, thereby resulting in a simultaneous stray parasitic suppression and containment function attributable to tandem shielding, and thereby enhancing energy conditioning.

In attaining minimum areas for various current loops in an isolated circuit system, additional shielding energy currents may be distributed around component shielding architectures. A plurality of shields as described hereinabove may be electrically coupled as either an isolated circuit's reference node, or chassis ground, and may be relied on as a commonly used reference pathway for a circuit. Thus, the various groups of internally paired, complementary pathways may include propagating energy originating from one or more energy sources propagating along external pathways coupled to the circuit by a conductive material. Energy may thus enter the device, undergo conditioning, and continue to each respective load.

The shielding structure may allow for a portion of a shield to operate as the pathway of low impedance for dumping and suppressing, as well as at least partially blocking return of unwanted electromagnetic interference noise and energy into each of the respective energized circuits. In an embodiment, internally located shields may be conductively coupled to a conductive area, thereby adaptively utilizing shielding structure for low impedance dumping and suppressing and at least partially blocking return blocking of unwanted electromagnetic interference noise and energy. Additionally, another set of internally located shields may be conductively coupled to a second conductive area, thereby utilizing shields for low impedance dumping, suppressing and at least partially blocking the return of unwanted electromagnetic interference noise and energy. The conductive areas may be electrically or conductively isolated from one another.

Simultaneous suppression of energy parasitics may be attributed to the enveloping shielding pathway structure, in combination with the cancellation of mutually opposing energy fields, and may be further attributed to the electrically opposing shielded pathway pathways and propagating energy along the various circuit pathways interacting within the various isolated circuits to undergo a conditioning effect taking place upon the propagating energy.

This conditioning may include minimizing effects of H-field energy and E-field energy through simultaneous functions, such as through isolated circuits that contain and maintain a defined electrical area adjacent to dynamic simultaneous low and high impedance pathways of shielding in which various paired pathways have their respective potentials respectively switching as a result of a given potential located on a shielding and used instantaneously and oppositely by these pairings with respect to the utilization by energy found along paired routings of the low and high impedance shields.

The various distance relationships created by the positional overlapping of energy routings within the isolated circuits combine with the various dynamic energy movements to enhance and cancel the various degrees of detrimental energy disruptions normally occurring within active components or loads. The efficient energy conditioning functions occurring within the passive layering architecture allow for development of a dynamic "0" impedance energy "black hole", or energy drain, along a third pathway coupled common to both complementary pathways and adapted to allow energy to be contained and dissipated upon the shielding, within the various isolated circuits and attached or conductively coupled circuits. Thus, electrically opposing energies may be separated by dielectric material and/or by an interposition shield structure, thereby allowing dynamic and close distance relationship within a specific circuit architecture, and thereby taking advantage of propagating energy and relative distances to allow for exploitation of mutual enhancing cancellation phenomenon and an electrostatic suppression phenomenon to exponentially allow layered conductive and dielectric elements to become highly efficient in energy handling ability.

According to an aspect of the present invention, a device may utilize a single low impedance pathway or a common low impedance pathway as a voltage reference, while utilizing a circuit maintained and balanced within a relative electrical reference point, thereby maintaining minimal parasitic contribution and disruptive energy parasitics in the isolated circuit system. The various attachment schemes described herein may allow a "0" voltage reference, as discussed hereinabove, to develop with respect to each pair or plurality of paired complementary conductors located on opposite sides of the shared central shield, thereby allowing a voltage to be maintained and balanced, even with multiple Simultaneous Switching Operations states among transistor gates located within an active integrated circuit, with minimal disruptive energy parasitics in an isolated circuit.

Shields may be joined using principals of a cage-like conductive shield structure to create one or more shieldings. The conductive coupling of shields together with a larger external conductive area may suppress radiated electromagnetic emissions and as a larger area provides a greater conductive area in which dissipation of voltages and surges may occur. One or more of a plurality of conductive or dielectric materials having different electrical characteristics may be maintained between shields. A specific complementary pathway may include a plurality of commonly conductive structures performing differentially phased conditioning with respect to a "mate", or paired, plurality of oppositely phased or charged structures forming half of the total sum of manufactured complementary pathways, wherein one half of the complementary pathways forms a first plurality of pathways, and wherein the second half forms a second plurality of pathways. The sum of the complementary pathways of the first and the second plurality of pathways may be evenly separated electrically, with an equal number of pathways used simultaneously, but with half the total sum of the individual complementary pathways operating from, for example, a range of 1 degree to approximately 180 degrees electrically out of phase from the oppositely positioned groupings. Small amounts of dielectric material, such as microns or less, may be used as the conductive material separation between pathways, in addition to the interposing shield, which dielectric may not directly physically or conductively couple to any of the complementarily operating shielded pathways.

An external ground area may couple or conductively connect as an alternative common pathway. Additional numbers of paired external pathways may be attached to lower the circuit impedance. This low impedance phenomenon may occur using alternative or auxiliary circuit return pathways.

A shield architecture may allow shields to be joined together, thereby facilitating energy propagation along a newly developed low impedance pathway, and thereby allowing unwanted electromagnetic interference or noise to move to this created low impedance pathway.

Figure 5A:
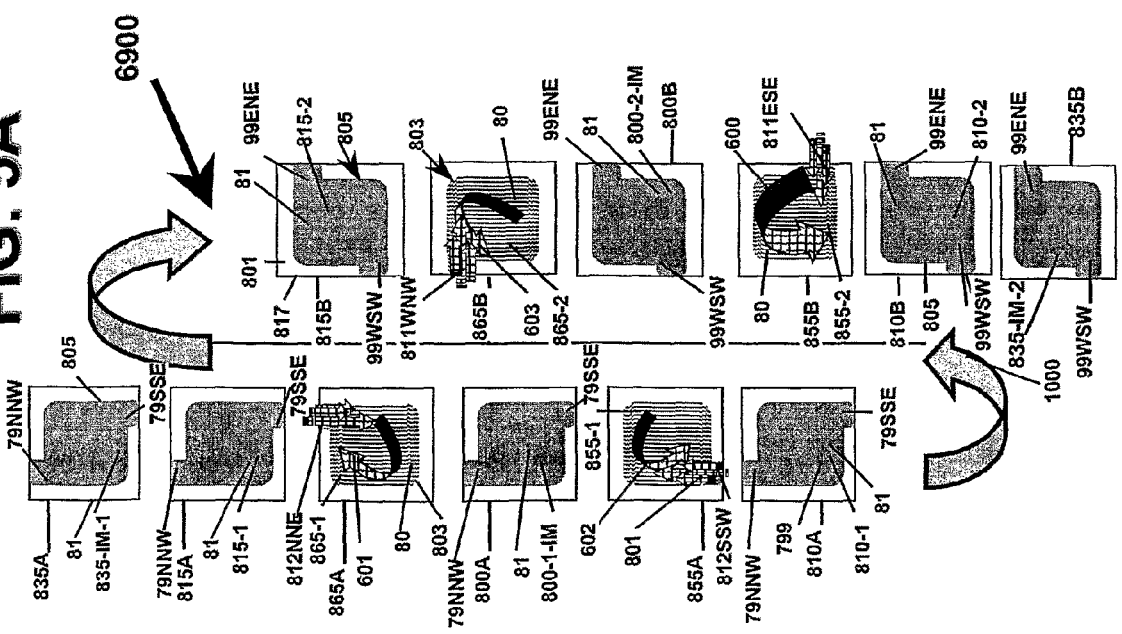
FIG. 5A shows a stacked multiple, circuit network including groups of pathways according to an aspect of the present invention.

Referring now to FIG. 1A through FIG. 5B, which generally show various common principals of both common and individual variants of an exemplary embodiment configured in a co-planar variant (FIGS. 1A-4I) and a stacked variant (FIGS. 5A and 5B).

In FIG. 1A, there are shown relative locations of the various pathway extensions disclosed according to an aspect of the present invention. A portion of a relative balanced and complementary-symmetrical arrangement utilizing a center shielding pathway designated 8"XX"-"X"M is adapted in the arrangement as the fulcrum of balanced conductive portions in a co-planar variant. A pathway arrangement including at least a first and a second plurality of pathways, wherein the first plurality has at least one pair of pathways arranged electrically isolated from each other and orientated in a first complementary relationship, is illustrated.

Additionally, at least a first half of the second plurality is arranged electrically isolated from a second half of the second plurality, wherein at least two pathways of the second plurality are electrically isolated from the pathways of first plurality. The pathway arrangement may also include a material having properties, such as dielectric, ferromagnetic, or varistor for example, spacing apart pathways of the pathway arrangement. The pathways of the first half of the second plurality are electrically coupled to one another, and the pathways of the second half of the second plurality are electrically coupled to one another. A total number of pathways of the first half of the second plurality may be an odd number greater than one, and a total number of pathways of a second half of the second plurality may also be an odd number greater than one. According to an aspect of the present invention, the pathways of the first half of the second plurality are positioned in a first superposed alignment, while the pathways of the second half of the second plurality are positioned in a second superposed alignment, with the first and second superposed alignments in a mutual superposed alignment herein defined as a co-planar arrangement.

In a non co-planar arrangement, the pathways of the first half of the second plurality may be positioned in a first superposed alignment, and the pathways of the second half of the second plurality may be positioned in a second superposed alignment, with the first and second superposed alignments in arrangement one atop the other. In one arrangement, at least four pathways are electrically isolated.

An illustrative embodiment of the present invention may include at least three pluralities of pathways, including a first plurality of pathways and a second plurality of pathways. The first and second pluralities of pathways may include pathway members of the first plurality having an equal and opposite pathway member found in the second plurality of pathways. Members of the first and second pluralities of pathways may be substantially the same size and shape, and may be positioned complementary, and may also operate in an electrically complementary manner. Thus, the pairings of the first and second pluralities of pathways may result in identical numbers of members of the first and second pluralities of pathways. An exemplary embodiment may provide at least a first and a second shield allowing for development of individual isolated low circuit impedance pathways. Structurally, the shields may be accomplished by a third plurality of pathways and a fourth plurality of pathways. Each shielding plurality may include shields of equal size and shape. Each of the third and fourth plurality of pathways may be conductively coupled. Conductive coupling may be accomplished by a variety of methods and materials known to those possessing an ordinary skill in the pertinent arts. Thus, when the third and a fourth plurality are grouped as two sets of shields utilizing the first and second plurality receiving shielding, the third and fourth pluralities may be coupled to a common pathway to develop a low circuit impedance pathway for energy propagation for conditioning of the circuit energy.

Pathways may additionally be arranged in a bypass arrangement, such that when placed face to face, main-body pathways 80 may be aligned superposed, with the exception of any pathway extensions such as 812NNE, 811NNE, 812SSW and 811SSW of the lower sub-circuit portion, for example, shown as mirror images depicted in FIG. 5A and FIG. 5B, for example.

Within the pluralities, individual pathway members may be of substantially the same size and shape and may be conductively coupled. However, individual pathway members of one plurality may not be conductively coupled to members of a different plurality of pathways.

There may be situations wherein members of one plurality may be connected to members of a different plurality, such as wherein a first plurality of shields and a second plurality of shields are externally coupled to the same conductor.

Common elements may include energy flow in accordance with conceptual energy indicators 600,601, 602,603 depicting the dynamic energy movements in co-planar shielded by-pass pathways, such as those shown in FIG. 1A-1C. An embodiment may provide for at least multiple shields for development of multiple isolated low circuit impedance pathways for multiple circuits.

Referring still to FIG. 1A, pathways may be shielded by the relative, common pathways, and may include a main-body pathway 80 with at least one pathway extension 812"X". The shields shown include a main-body shield pathway 81 with at least one pathway extension designated 99"X"/79"X". The shields may sandwich and envelope the main-body 799, including a conductive inner pathway formed of conductive materials from the family of noble or base metals traditionally used in co-fired electronic components or conductive material, such as Ag, Ag/Pd, Cu, Ni, Pt, Au, Pd, or combination materials such as metal oxide and glass frit. A capacitance and a resistance value may be achieved in one family of pathways, as described hereinabove, such as by use of ruthenium oxide as the resistive material and Ag/Pd as the conductive material. Further, variations in pathway geometry may yield different resistance and capacitance values. Variations may be achieved by altering the materials from which the pathways are made. For example, a conductive metal, such as silver, may be selectively added to the metal oxide/glass frit material to lower the resistance of the material.

A plurality of pathways, 865-1 and 865-2, are shown positioned co-planar and spaced apart on a same portion of material 801. Each pathway of the co-planar pathways 865-1 and 865-2, may be formed of conductive material 799, or a hybrid of conductive material and another material, herein designated as 799"x". Each co planar pathway 865-1 and 865-2 may also be formed as a bypass pathway, wherein each pathway includes a main-body pathway 80 having a corresponding main-body edge and perimeter, 803A and 803B, respectively and at least one pathway contiguous extension 812"X". Each co-planar pathway 865-1 and 865-2, may include at least one pathway contiguous extension 812SSW and 811SSW with a portion of the main-body edge 803A and 803B extending therefrom. Extension 812"X" is a portion of the pathway material formed in conjunction with a main-body pathway 80 from which it extends. Main-body pathway 80, an 812"X" may be found as an extension of material 799 or 799"x" extending beyond an accepted average perimeter edge 803"X". Extensions 812"X" and 79"X" may be found respectively positioned as a contiguous portion of the pathway from which it is formed. Each main-body pathway may have edge 803A, 803B positioned relative and spaced apart a distance 814F from the embodiment edge 817. Embodiment edge 817 may include a material 801. Co-planar main-body pathway's edge 803"x" may be positioned and spaced apart a distance 814J. Pathway extensions 812SSW and 811SSW may conductively couple a respective pathway main-body 80 to an outer pathway 890SSW and 891 SSW, which may be positioned at edge 817. The co-planar arranged, main-body pathway 80 may be positioned "sandwiched" between the area of registered coverage of two layering of co-planar, main-body pathway 81 *s*.

Combining mutually opposing fields causes a cancellation or minimization effect. The closer the complementary, symmetrically oriented shields, the better the resulting mutually opposing cancellation effect on opposing energy propagation. The more superposed the orientation of the complementary, symmetrically oriented shields is, the better the resulting suppression of parasitics and cancellation effect.

Referring still to FIG. 1A, the edges of the plurality of co-planar shields may be represented by dotted lines 805A and 805B. Main-body pathways 81 of each of the plurality of shields are larger than a sandwiching main-body pathway 80 of any corresponding sandwiched pathway. This may create an inset area 806 relative to the positions of the shields and remaining pathways. The size of main-bodies 80 and 81 may be substantially similar, and thus the insetting positioning relationships may be minimal in certain embodiments. Increased parasitic suppression may be obtained by insetting pathways, including a main-body 80, to be shielded by larger pathway main-body 81s. For example, an inset of a main-body 80 of pathways 865-1 inset may be separated a distance of 1 to 20+ times the spacing provided by the thickness of the material 801 separating pathway 865-1 and adjacent center co-planar pathway 800-IM-1, as illustrated in FIG. 1B.

Plurality of co-planar shield edges 805A and 805B may be positioned and spaced apart a distance 814K, and may be a distance 814 relative to edges 805A and 805B and the edge 817. Other distances 814J relative from either edges 803A and 803B may be provided.

Further, distance 814F may be present between one 803"X" and an edge 817. Each co-planar shield may include a plurality of contiguous pathway extension portions, such as, for example, portions 79NNE, 79SSE, 99NNE and 99SSE, extending from the plurality of co-planar shield edges 805A and 805B. Plurality of co-planar shields may include a plurality of outer pathway material 901 NNE, 901 SSE, 902NNE and 902SSE positioned at the edge 817.

Conceptual energy indicators 602 represent the various dynamic energy movements within the co-planar pathways 865-1 and 865-2. Unwanted energy may be transferred to the co-planar shields in accordance with the provision by the shields providing for a low impedance pathway, which shields may additionally be electrically coupled to another pathway or conductive area.

Referring now to FIGS. 1 B and 1 C, layer sequences are illustrated for a first plurality of co-planar pathways 865-1, 865-2, a second plurality of co-planar pathways 855-1,855-2, and a third plurality of co-planer pathways 825-1-IM, 825-2-IM, 815-1,815-2, 800-1-IM, 800-2-IM, 810-1, 810-2, and 820-1-IM, 820-2-IM. The first, second, and third pluralities may be stacked to form an embodiment 3199,3200, 3201. The third plurality of co-planar pathways may provide shielding. Main-bodies 81 of the plurality of co-planer shields 825-1-IM, 825-2-IM; 815-1,815-2; 800-1-IM, 800-2-IM; 810-1, 810-2; and 820-1-IM, 820-2-IM may be substantially similar in size and shape, and may be spaced apart in co-planar locations on different layers of material 801. The first plurality of co-planar pathways 865-1 and 865-2 may have at least the corresponding, opposing, and complementary second plurality of co-planar pathways 855-1 and 855-2. These first and second pluralities of co-planar pathways, when oriented face to face, may have main-body pathways 80s co-registered and aligned except for the various contiguous pathway extensions 812"X", 811"X". As shown in FIGS. 1B and 1C, a pair of outer co-planar pathways 820-1-IM, 825-1-IM may serve as pathway shields, thereby improving the shielding effectiveness of the other conductively coupled pluralities of pathways with a main-body 81 s.

As illustrated in the varied embodiments 3199,3200, 3201, the location of extensions 79NNE, 79SSE, of shields 825-1-IM, 815-1, 800-1-IM, 810-1, and 820-1-IM and extensions 99NNE, 99SSE of the shields 825-2-IM, 815-2, 800-2-IM, 810-2, and 820-2-IM, may be varied. In FIG. 1B, for example, extensions 79NNE and 99NNE may be arranged spaced apart, diagonally from extensions 79SSE and 99SSE and on opposite sides of shield main-body 81. In FIG. 1C, for example, extensions 79NNE and 99NNE may be arranged spaced apart in line with extensions 79SSE and 99SSE on opposite sides of shield main-body 81. In FIG. 1 B, extensions 812NNE and 811NNE may be arranged spaced apart, extending toward the same edge 812 of layer of material 801, and extensions 812SSW and 811SSW may be arranged spaced apart, each extending toward the opposite edge 812 of layer of material 801. In FIG. 1 C, pathways 865-1 and 865-2 may be mirror images, as discussed hereinabove. Comparably to FIG. 1B, extensions 812NNE and 811NNE may be arranged spaced apart, extending toward opposite edges 817 of layer of material 801. Extensions 812SSW and 811SSW may be arranged spaced apart, extending toward the opposite edge of layer of material 801, such that extensions 812NNE and 811SSW extend toward opposite edges 812"X" of the respective layer of material 801.

Referring now to FIGS. 2A and 2B, FIG. 2A illustrates a schematic plan view of a an embodiment of FIG. 2B according to an aspect of the present invention. FIG. 2B depicts a pathway arrangement including a layout of a first, a second, a third, a fourth, a fifth, a sixth, a seventh, a eighth, a ninth and a tenth pathway, wherein at least the third and the fourth pathway, for example, may be co-planar and arranged spaced apart from each other. FIG. 2B illustrates the first and the second pathway arranged below the third and the fourth pathway, and the fifth and the sixth pathway arranged above the third and the fourth pathway, and the seventh and the eighth pathway arranged above the fifth and the sixth pathway, and the ninth and the tenth pathway, arranged above the seventh and the eighth pathway. These pathways have various respective internal contiguous pathway extensions 812"X", 811"X", 79"X" and 99"X", and may be discrete components having the same minimal numbers of layering.

Internal contiguous pathway extensions 812"X", 811"X", 79"X" and 99"X", and conductively coupled external pathways 890"X", 891"X"802"X" and 902"X", may be coupled to the inner pathway of the plurality of co-planar pathways of the main-body pathway 80 and 81.

Referring now to FIGS. 3A and 3B, in FIG. 3A there is shown a schematic plan view of an embodiment of FIG. 3B, wherein outer pathways may be selectively conductively coupled in at least two isolated circuit portions. FIG. 3B depicts an pathway arrangement including a minimal layout of a first, a second, a third, a fourth, a fifth, a sixth, a seventh, a eighth, a ninth and a tenth pathway, wherein at least the third and the fourth pathway, for example, are co-planar and arranged spaced apart from each other. The device shown in FIG. 3B may have the first and the second pathway arranged below the third and the fourth pathway, and the fifth and the sixth pathway arranged above the third and the fourth pathway, and the seventh and the eighth pathway arranged above the fifth and the sixth pathway, and the ninth and the tenth pathway arranged above the seventh and the eighth pathway. These pathways have various respective internal contiguous pathway extensions 812"X", 811"X", 79"X" and 99"X", and may be discrete components having the same minimal number of layering.

Referring now to FIG. 3C, a plan view of a shield according to an aspect of the present invention is illustrated. The embodiment depicted in FIG. 3C includes at least one additional pathway, as compared to the device of FIG. 3B. This additional pathway 1100-IM"X" may be one of at least a plurality of shields in the stack of pathways, which shields may span across the two circuit portions. Pathway 1100-IM"X" may be one of at least two outer sandwiching shields in the stack of pathways. Shields may span across the two circuits by adding a centrally arranged 1100-IM"X" pathway electrically coupled to the outer 1100-IM"X" shields.

Pathways 1100-IM"X" may have at least one extension, and are illustrated with two extensions 1099NNE and 1099SSE, and may allow for sandwiching shields for all of the pathways within the present invention. At least three shields may be coupled together and may include a centering shield dividing an energy load or energy source of an isolated circuit or dividing two isolated circuits.

A shield DOGS may be electrically isolated from other shields and may be arranged to effect an energy propagation of an isolated circuit. An isolated circuit may be sandwiched by a shield. A shield may be electrically coupled to a conductive area that is isolated from any other conductive areas thereby effecting an energy propagation.

FIGS. 4A-4I depict assembled components of various embodiments according to aspects of the present invention. The arrangements of FIG. 4A to FIG. 4I may include minimal layouts of a first, a second, a third, a fourth, a fifth, a sixth, a seventh, a eighth, a ninth and a tenth pathway, wherein at least the third and the fourth pathway, for example, are co-planar and arranged spaced apart from each other. The first and the second pathway may be arranged below the third and the fourth pathway, and the fifth and the sixth pathway may be arranged above the third and the fourth pathway, and the seventh and the eighth pathway may be arranged above the fifth and the sixth pathway, and the ninth and the tenth pathway may be arranged above the seventh and the eighth pathway. These pathways have various respective internal contiguous pathway extensions 812"X", 811"X", 79"X" and 99"X", and may be an assembled final discrete component, for example.

Referring to FIG. 5A, there is shown a stacking of multiple, non-shared circuits including groups of pathways according to an aspect of the present invention. Included in FIG. 5A is a marker 1000 showing a continuation of the stacking arrangement to the next column of FIG. 5A. Conceptual energy indicators 600, 601, 602, 603 indicate energy flow.

Material 799 may be deposited on material 801 for component 6900 shields designated 815-1, 800-1, 810-1-IM, 815-2, 800-2-IM, and 810-2. Shields 810-A and 810-B are separated shields of at least part of an isolated circuit system. Shields 815-A and -B are separated shields of at least part of an isolated circuit system. Shields 820-A and 820-B are separated shields at least part of an isolated circuit system. Shields 825-A and 825-B are separated shields at least part of an isolated circuit system. Conductors 855-1 and 855-2 are separated and shielded pathways in bypass configuration. Conductors 865-1 and 865-2 are separated and shielded pathways in bypass configuration. In FIG. 5A, a pathway arrangement is depicted including at least six orientations of pathways of two types of pathways, wherein each orientation of the pathways of the at least six orientations of pathways provides conductive isolation from the remaining orientations of pathways.

Referring to FIG. 5B, there is shown a stacked shield structure according to an aspect of the present invention. FIG. 5B depicts an embodiment similar to that of FIG. 5A, wherein two sets of 855"X" and 865"X" pathways are omitted for purposes of clarity, and wherein the shields of FIG. 5A are oriented in flip-flop for each relative set of 855"X" and 865"X" pathways. The 79"X" pathway extensions may be rotated 90 degrees relative to the various pathway extensions 811"x" and 812"X". A dynamic result of this configuration, as illustrated by the conceptual energy indicators, may be enhanced by nulling the extensions of the two sets of 855"X" and 865"X" pathways of the two isolated circuits, and by relatively positioning the shield of each isolated circuit pairing 855A and 865A approximately 90 degrees null to the various pathway extensions of 855B and 865B.

Referring to FIG. 5B, there is shown a stacked shield structure according to an aspect of the present invention. FIG. 5B depicts an embodiment similar to that of FIG. 5A, wherein two sets of 855"X" and 865"X" pathways are omitted for purposes of clarity, and wherein the shields of FIG. 5A are oriented in flip-flop for each relative set of 855"X" and 865"X" pathways. The 79"X" pathway extensions may be rotated 90 degrees relative to the various pathway extensions 811"x" and 812"X". A dynamic result of this configuration, as illustrated by the conceptual energy indicators, may be enhanced by nulling the extensions of the two sets of 855"X" and 865"X" pathways of the two isolated circuits, and by relatively positioning the shield of each isolated circuit pairing 865B and 865A approximately 90 degrees null to the various pathway extensions of 865B and 865A.

As discussed hereinabove, in an embodiment of the present invention, multiple complementary or paired shielded pathways may include the first and second pluralities of pathways. Energy may utilize the various paired, feed-through or bypass pathway layers in a generally parallel and even manner, for example. Pathway elements may include non-insulated and conductive apertures, and conductive through-VIAs, to provide propagating energy and maintain a generally non-parallel or perpendicular relationship, and additionally maintain a separate electrical relationship with an adjoining circuit. These pathways may maintain balance internally, and may facilitate an electrical opposition along opposing complementary pairings. This relationship among complementary pairs of pathways may occur while the pathways and the energy are undergoing an opposite operational usage within the shielding structure attached externally.

Referring now to FIG. 5C, there is shown a relative plan view of a stacked multiple, non-shared circuit network having VIAS and including groups of pathways according to an aspect of the present invention. The device according to an aspect of the present invention depicted in FIG. 5C includes a hole-through energy conditioner. Hole-through energy conditioners may be formed such that many of the energy propagation principals disclosed herein are retained, including the use of multiple sets of shields for energy conditioning possessing. FIG. 5C, further depicts null pathway sets with pathway arrangement 6969.

Pathway arrangement 6969 is similar to FIG. 5B, with the absence of pathway extensions 79"X", 811"x" and 812"X", and with the substitution of 8879"X", 8811"X" and 8812"X" VIAs functioning from a different direction relative to the main-body 80 and 81.

Referring still to FIG. 5C, during the manufacturing process, conductive holes 912, VIAS or conductive apertures may be used to interconnect 8806 an integrated circuit, and may be formed through one or more pathway layers using mechanical drilling, laser drilling, etching, punching, or other hole formation techniques. Each specific interconnection 8806 may enable various pathways to be electrically connected or insulated. Each specific interconnection 8806 may extend through all layers of pathway arrangement 6969, or may be bounded above or below by one or more layers. Pathway arrangement 6969 may include an organic substrate, such as an epoxy material, or patterned conductive material. If an organic substrate is used, for example, standard printed circuit board materials such as FR-4 epoxy-glass, polymide-glass, benzocyclobutene, Teflon, other epoxy resins, or the like could be used in various embodiments. In alternate embodiments, a pathway arrangement could include an inorganic substance, such as ceramic, for example. In various embodiments, the thickness of the levels may be approximately 10-1000 microns. Interconnections 8806 between the various conductive layers may also be formed by selectively removing dielectric and conductive materials, thereby exposing the conductive material of the lower conductive layers 904, and by filling the holes so formed by the removal with a conductive paste 799A or electrolytic plating 799B, for example.

Interconnections 8806 may couple exposed conductive layers to a relative side of the pathway arrangement 6969. Interconnections 8806 may take the form of pads or lands to which an integrated circuit may be attached, for example. Interconnections 8806 may be formed using known techniques, such as by filling the selectively removed portions of dielectric with conductive paste, electrolytic plating, photolithography, or screen printing, for example. The resulting pathway arrangement 6969 includes one or more layers of patterned conductive material 904, separated by non-conducting layers, and interconnected by interconnects 8806. Different techniques may be used to interconnect and isolate the various layers of patterned conductive material 799. For example, rather than forming and selectively removing portions of the various conducting 799 and non-conducting layers 801, openings between the various layers may be included by selectively adding the desired portions of the conducting 799 and non-conducting layers 801. Removal techniques, such as chemical mechanical planarization, may be used to physically abrade away multiple layers of different types of conducting and non-conducting materials, resulting in the desired openings for various interconnects.

Pathway arrangement 6969 may be configured using a multi-aperture, multilayer energy conditioning pathway set, with a substrate format adapted to condition propagating energy. Pathway arrangement 6969 may condition propagating energy by utilizing a combined energy conditioning methodology of conductively filled apertures, known in the art as As 8879"X", 8811"X" and 8812"X", in combination with a multi-layer common conductive Faraday cage-like shielding technology with immured propagational pathways.

Interconnecting pathway arrangement and an IC may be achieved with wire bonding interconnection, flip-chip ball-grid array interconnections, microBall-grid interconnections, combinations thereof, or any other standard industry accepted methodologies. For example. a "flip chip" type of integrated circuit, meaning that the input/output terminations as well as any other pathways on the chip may occur at any point on its surface. After the IC chip is prepared for attachment to pathway arrangement 6969, the chip may be flipped over and attached, by solder bumps or balls to matching pads on the top surface of pathway arrangement 6969. Alternatively, an integrated circuit may be wire bonded by connecting input/output terminations to pathway arrangement 6969 using bond wires to pads on the top surface of pathway arrangement 6969.

The circuits within pathway arrangement 6969 may act as a source to load pathway arrangement requiring capacitance, noise suppression, and/or voltage dampening. This capacitance may be provided by formation of the capacitance developed and embedded within pathway arrangement 6969. This capacitance may be coupled to the integrated circuit loads using a paired pathway and the shield, as described above. Additional capacitance may be provided to a circuit electrically coupled to an integrated circuit to provide voltage dampening and noise suppression. Close proximity of off-chip energy sources may provide a capacitance each along the low inductance path to the load. Common shielding pathways may be utilized as the "0" voltage circuit reference node for both off-chip energy sources the common conductive interposer energy pathway configurations.

Pathway arrangement 6969 may be connected to an integrated circuit by commonly accepted industry connection methods and couplings 799A and 799B, including Bumpless Build-Up Layer (BBUL) packaging. This technology enables higher performance, thinner and lighter packages, and lowers power consumption. In a BBUL package, the silicon die or IC is embedded in a package with a pathway arrangement operable as a first level interconnect.

Thus, the BBUL package as a whole is not just attached to one surface of the IC. For example, electrical connections between the die and one or more of the various shields and the package may be made with copper lines, not necessarily C4 solder bumps. These features combine to make the package thinner and lighter than other IC packages, while delivering higher performance and reducing power consumption. BBUL may enhance the ability of a manufacturer to couple multiple silicon components to pathway arrangement 6969.

Shielded pathways 8811, 8812, and 8879 may be electrically connected between respective energy sources and respective load of the IC by common industry methodologies, thereby allowing for conditioning of propagating energy. Shields 8879 may conductively coupled to a shield including 1055-2. A shield and its other conductive portions including 8811 and 8812 may be electrically coupled to a respective complementary pathway which poses no polarity charge of significance before hook-up, thereby preventing each layer 8811 and 8812 from changing energy propagation direction functions, such preventing layer 8811 and 8812 from changing from input and output to output and input, respectively, as is understood by those possessing an ordinary skill in the pertinent arts.

For stacked variants depicted in FIGS. 5A, 5B and 5C, adding three pathways 1100-IM-"X", including one between 810-1 and 815-2, designated as 1100-IM-"C", may bisect a balanced symmetry of the total number of pathways located into equal numbers on opposite sides of 1100-IM-"C". The addition of 1100-IM-1 and 1100-IM-2, electrically coupled to 1100-IM-C, creates a common or a shield structure (not all shown). Shields of a shield structure may be of substantially the same size or not. Shields may or may not be physically isolated from any other shields for any one or more embodiments of the present invention. Thus, shields may or may not be electrically or conductively isolated from any other shields for any one or more embodiments of the present invention.

An odd number of shields may be coupled together thereby allowing formation of a common reference or node utilizing all other shields. The number of shields 1100-IM-"X" is not confined to using extensions 1099NNE and 1099SSE such as shield DOGS, as any number of extensions in almost any direction may be used to facilitate a coupling. A relative balanced and complementary-symmetrical arrangement may be formed with respect to a center shield 8"XX" or shield 800/800-IM for a as the arrangement fulcrum of balanced conductive portions. At least a partial flux field cancellation of energy propagating along or between paired and electrically opposing complementary pathways occurs in this balanced but shifted embodiment. Further, simultaneous stray energy parasitics, complementary charged suppression, physical and electrical shielding containment and a faraday effect may also occur. This result is achieved because the magnetic flux energies travel at least partially along the shield wherein the RF return path is parallel and adjacent to a corresponding pathway. Thus, the magnetic flux energy may be measured or observed relative to a return Shifted pathways may be in relative balance and complementarily and symmetrically positioned with respect to center shields, such as shields 800/800-"X"-IM, and may include a relatively shifted, balanced, complementary, and symmetrical arrangement of predetermined shields and pathways complementarily sandwiched around a centrally positioned shield, such as 800/800-IM, for example.

The exemplary embodiments of FIGS. 1A, 1B, 1C, through FIG. 4I, for example may include these 'shifted' embodiments. These shifted embodiments may include a multiplicity of layers having a shielding, a pathway, a shielding, an pathway, and a shielding. Each of these multiplicity of layers may be centered and complementary about a center shield 800/800-"X"-IM, such as for co-planar variants, and the entire multiplicity of layers may be centered about a main center shield. Complementarity and balance may be maintained about the center shield, and the main center shield, although individual shields may be shifted to create discrete imbalances as between a given matched pathway pair, for example. Shifting may expose a portion of at least one pathway outside the perimeter of the superposed shielding, thereby allowing for parasitics and thereby varying, for example, impedance characteristics.

For example, a given pathway may be shifted 5 points to the left. This shifting may be accounted for in the matched pairs about a center shield, and, consequently, either an adjacent matched pair pathway of opposing polarity may be shifted 5 points, or 5 adjacent pathways of opposite polarity may each shift 1 point, thereby maintaining complementarity and balance. Further, pathways may remain within the perimeter of the superposed shielding, and nonetheless be shifted thereunder. Such a shifting under the shielding may, nonetheless, make desirable a balancing. However, certain exemplary embodiments not shown may include situations wherein pathways are pulled toward the center of a shield, and remain under the shield evidencing differing electrical characteristics, such as inductive behavior, in a balanced or unbalanced state.

Figure 6:
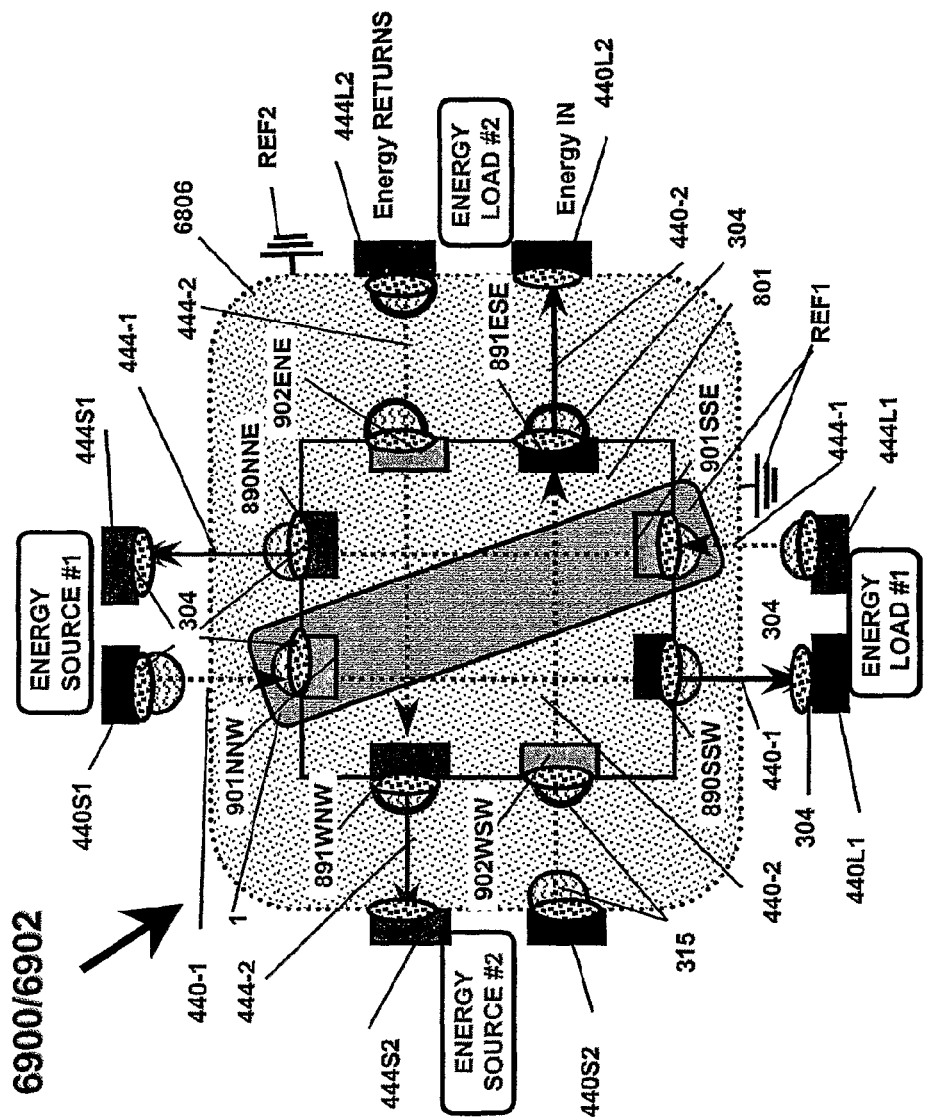
FIG. 6 shows a relative plan view of circuit arrangement variant according to an aspect of the present invention; and, FIG. 7 shows a relative plan view of circuit arrangement variant according to an aspect of the present invention.

Referring now to FIG. 6, there is shown a stacked multiple circuit including embodiment 6900, conductive energy pathways, isolated energy sources, isolated energy-utilizing loads, and isolated common conductive pathways. The conductive energy pathways may be conductively coupled to embodiment 6900 by a conductive coupling material, such as, for example, by a solder or industry equivalent. Vias 315, conductive pathways continuing below the surface of the substrate, may couple to the conductive pathways, and may include conductive material that serves as a contiguous conductive pathway for propagating energies. The isolated common conductive pathways may not be directly coupled to the isolated energy sources or the isolated energy-utilizing loads. As discussed hereinabove, embodiment 6900 may include four pluralities of pathways including electrodes and shields, with each plurality electrically isolated. The shields may be conductively coupled. The conductively coupled shields may be externally coupled to an isolated common conductive pathway, which is not directly conductively coupled to the electrodes, using a conductive coupling material. As shown in FIG. 6 an electrode, 815-1, 800-1-IM and 810-1, may be conductively coupled to 802GA, 802GB. A shield, 815-2, 800-2-IM, and 810-2, may be conductively coupled to 902GA and 902GB. These couplings may not be conductively coupled to the first plurality of electrodes or the second plurality of electrodes. In this configuration, both isolated circuits may be utilizing the isolated and separate voltage references and an isolated common impedance path such as REF 1 and REF 2 in FIG. 6.

Figure 7:
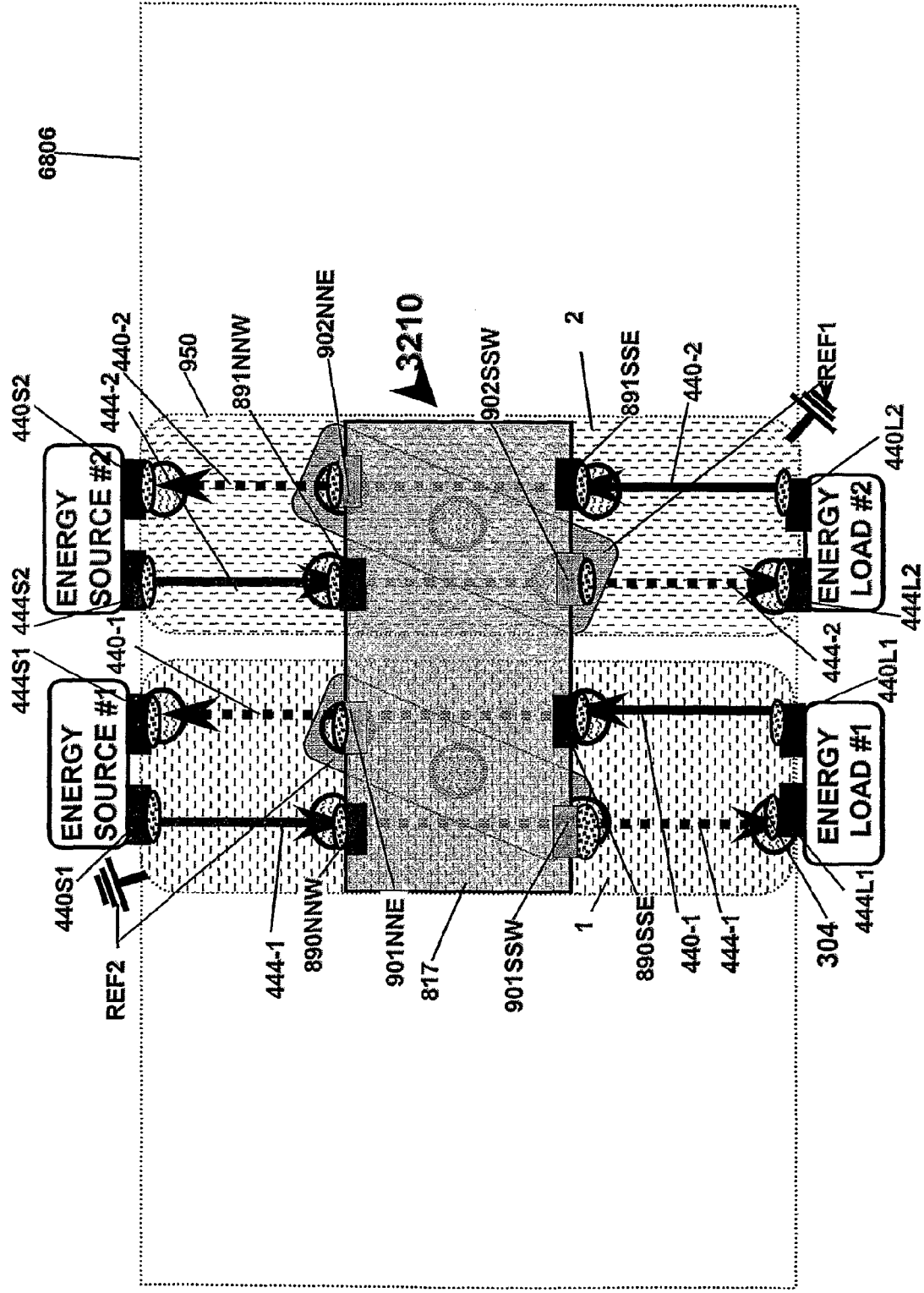
Figure 6:
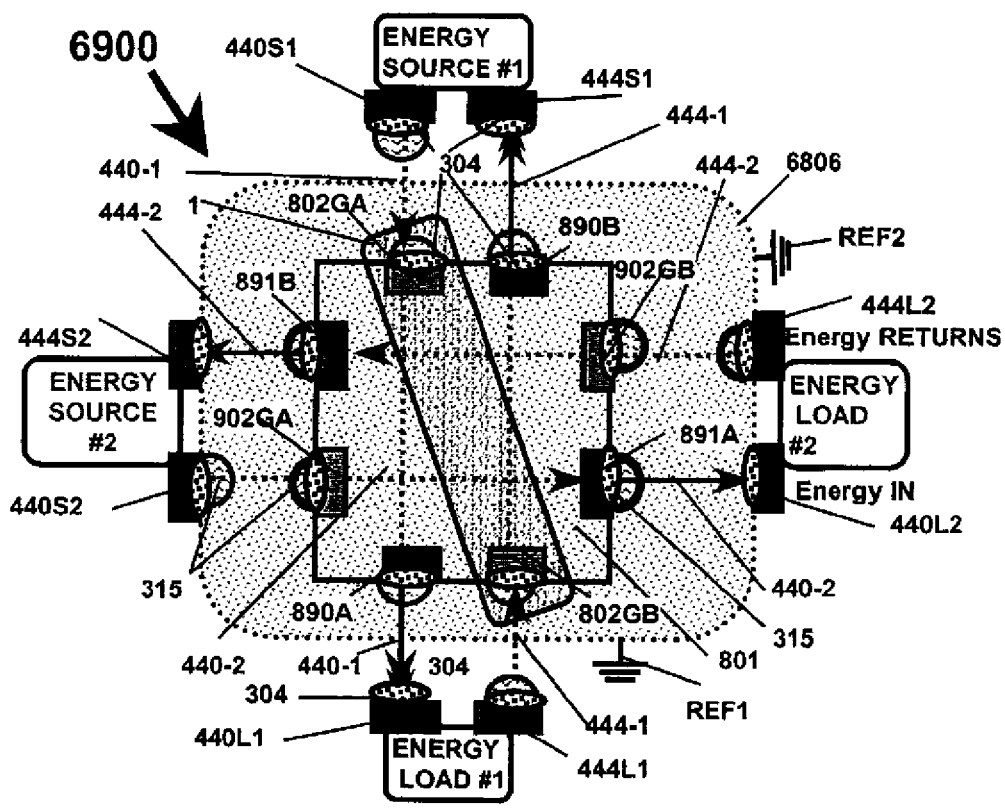

Referring now to FIG. 7, there is shown a stacked co-planar multiple circuit including embodiment 3210, conductive energy pathways, isolated energy sources, isolated energy-utilizing loads, and isolated common conductive pathways. The conductive energy pathways may be conductively coupled to embodiment 3210 by a conductive coupling material. Vias 315, conductive pathways continuing below the surface of the substrate, may couple to the conductive pathways and may include conductive material that serves as a contiguous conductive pathway for propagating energies. The isolated common conductive pathways may not be directly coupled to the isolated energy sources or the isolated energy-utilizing loads. As discussed hereinabove, embodiment 3210 may include four pluralities of pathways including electrodes and shields, with each plurality electrically isolated. The conductively coupled shields may be externally coupled to an isolated common energy pathway, which is not directly conductively coupled to the first or the second plurality of electrodes in this co-planar arrangement. A third plurality of electrodes, 815-1, 800-1-IM and 810-1 may be conductively coupled to 802GA, 802GB, 815-2 and 800-2-IM, and also, may be conductively coupled to 902GA, 902GB, and may not be conductively coupled to the first plurality or the second plurality. In this configuration, both isolated circuits may be utilizing a separate and a respective isolated and separate voltage reference and a separate and a respective isolated impedance path, a separate and a respective isolated common impedance path and at least one separate and respective low inductance pathway such as REF 1 and REF 2 in FIG. 7.

Referring now to FIG. 4A thru to FIG. 7, the termination electrodes 890A, 890B, and 891A, 891 B, 802GA, 802GB, and 902GA, 902GB, may be monolithic or multi-layered.

Termination electrodes 802GA, 802GB, 902GA, 902GB, may be located at other respective portions of a sintered body. Each main body electrode layers 81 or 80, and the associate electrode extensions 99/79G"X" or 812"X", may define an electrode which extends to, and conductively couples to, the associated termination electrodes 802GA, 802GB, 902GA, 902GB and 890A, 890B, and 891A, 891B.

The present invention may be utilized for many energy conditioning functions that utilize commonly coupled shielding structure element for emulating a center tap of resistor/voltage divider network. This resistor/voltage divider network may be normally constructed using a ratio of various integrated circuit resistors. However, various integrated circuit resistors may be replaced by a device according to an aspect of the present invention, the device utilizing, for example, specific conductive/resistive materials 799A or naturally occurring resistance properties of pathway material 799, or utilizing a varied physical layout.

A voltage dividing function may be present as portions of a common and shared pathway shield structure are utilized to define a common voltage reference located at both respective sides of the common pathway shield structure.

In embodiments, whether initially stacked vertically during a manufacturing process, or in combination with a co-planar pairings as described hereinabove, the number of complementary pathways pairings may be multiplied in a predetermined manner to create a number of pathway element combinations of a generally physically or electrically parallel nature.

Further, although not shown, a device of the present invention may be fabricated in silicon and directly incorporated into integrated circuit microprocessor circuitry or microprocessor chip packaging. Any suitable method for depositing electrically conductive materials may be used, such as plating, sputtering, vapor, electrical, screening, stenciling, vacuum, and chemical including chemical vapor deposition (CVD).

While certain embodiments have been herein described in position as "upper" or "above", or "lower" or "below", or any other positional or directional description, it will be understood that these descriptions are merely relative and are not intended to be limiting.

The present invention may be implemented in a number of different embodiments, including a energy conditioning embodiment as an energy conditioner for an electronic assembly, an energy conditioning substrate, an integrated circuit package, an electronic assembly or an electronic system in the form of a energy conditioning system, and may be fabricated using various methods. Other embodiments will be readily apparent to those of ordinary skill in the art.

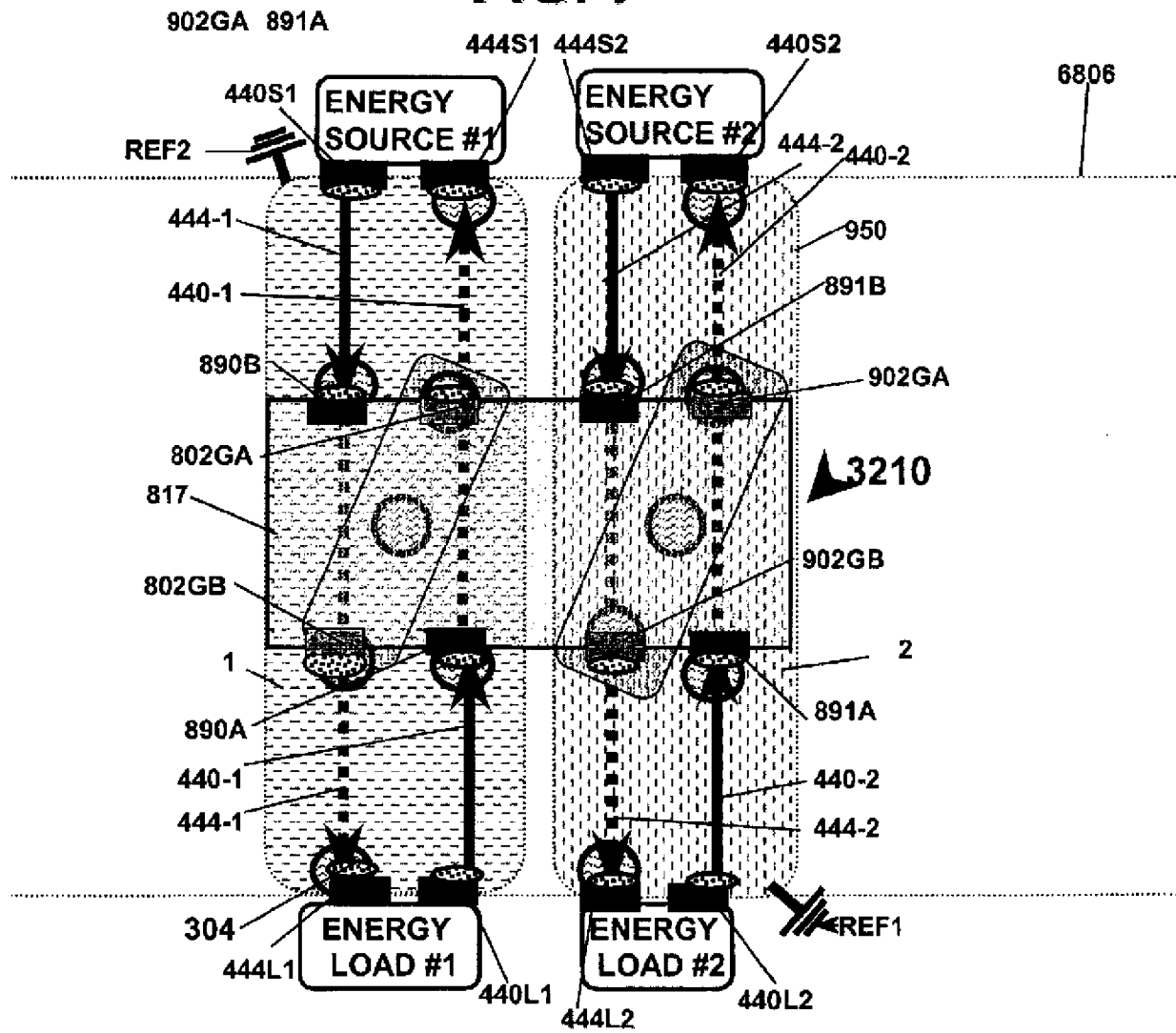

The invention claimed is:

1. An energy pathway arrangement, comprising:
a first conductor including a first conductive plane area;
a second conductor including a second conductive plane area;
a third conductor including a third conductive plane area;
a fourth conductor including a fourth conductive plane area;
a fifth conductor including a fifth conductive plane area;
wherein said first conductor, said third conductor and said fifth conductor are conductively coupled to one another, and wherein said second conductor and said fourth conductor are electrically insulated from each other;
wherein a portion of said second area is substantially the same size as a portion of said fourth area, and wherein said third area is larger than said portion of said second area;
wherein said portion of said second area is in a first position, and wherein said first position is between said first area and said third area, and wherein said portion of said second area is substantially parallel with said first area, said third area, said portion of said fourth area and said fifth area;
wherein said portion of said fourth area is in a second position, and wherein said second position is between said third area and said fifth area, and wherein said portion of said fourth area is substantially parallel with said first area, said portion of said second area, said third area, and said fifth area; and
wherein said portion of said second area is oriented to face said portion of said fourth area, and wherein said portion of said second area and said portion of said fourth area are shielded from each other by said third area.

2. The arrangement as recited in claim 1, wherein said first position and said second position form a substantially superposed alignment of said portion of said second area with said portion of said fourth area.

3. The arrangement as recited in claim 1, wherein said portion of said second area is spaced apart from said third area by a first distance, and wherein said portion of said fourth area is spaced apart from said third area by a second distance; and
wherein said first distance is substantially the same as said second distance.

4. The arrangement as recited in claim 2, wherein said portion of said second area is spaced apart from said third area by a first distance, and wherein said portion of said fourth area is spaced apart from said third area by a second distance; and
wherein said first distance is substantially the same as said second distance.

5. An energized circuit incorporating the arrangement of claim 4, wherein said third area sustains a first voltage for a first energy propagating said portion of said second area; and
wherein said third area sustains said first voltage for a second energy propagating said portion of said fourth area.

6. The arrangement of claim 3, further comprising:
a sixth conductor including a sixth conductive plane area;
a seventh conductor including a seventh conductive plane area;
an eighth conductor including an eighth conductive plane area;
a ninth conductor including a ninth conductive plane area;
a tenth conductor including a tenth conductive plane area;
wherein said second conductor and said fourth conductor are electrically insulated from said first conductor, said third conductor and said fifth conductor; and
wherein said second conductor and said fourth conductor are electrically insulated from said seventh conductor and said ninth conductor.

7. The arrangement as recited in claim 4, wherein said first conductor, said third conductor and said fifth conductor are electrically insulated from said second conductor and said fourth conductor.

8. An energized circuit incorporating the arrangement of claim 7, further comprising;
a first capacitance having a capacitive value, wherein said first capacitance is operable between said third area and said portion of said second area;
a second capacitance having a capacitance value, wherein said second capacitance is operable between said third area and said portion of said fourth area;
a third capacitance having a capacitance value, and wherein said third capacitance is operable between said portion of said second area and said portion of said fourth area;
wherein said capacitance value of said first capacitance is substantially the same as said capacitance value of said second capacitance, and wherein said capacitance value of said third capacitance is approximately half of said capacitance value of said first capacitance;
wherein said third area sustains a first voltage for a first energy propagating said portion of said second area; and
wherein said third area sustains said first voltage for a second energy propagating said portion of said fourth area.

9. The energized circuit of claim 5, further comprising;
a first capacitance having a capacitive value, wherein said first capacitance is operable between said third area and said portion of said second area;
a second capacitance having a capacitance value, wherein said second capacitance is operable between said third area and said portion of said fourth area;
a third capacitance having a capacitance value, and wherein said third capacitance is operable between said portion of said second area and said portion of said fourth area; and
wherein said capacitance value of said first capacitance is substantially the same as said capacitance value of said second capacitance, and wherein said capacitance value of said third capacitance is approximately half of said capacitance value of said first capacitance.

10. The arrangement of claim 6, wherein said first position and said second position form an overlap alignment of said portion of said second area with said portion of said fourth area.

11. An energy pathway arrangement, comprising:
a first conductor comprising a first conductive plane area;
a second conductor comprising a second conductive plane area;

a third conductor comprising a third conductive plane area, and wherein said third conductive plane area has a portion of said third conductive plane area that includes a first side of said portion of said third conductive plane area and a second side of said portion of said third conductive plane area;

a fourth conductor comprising a fourth conductive plane area;

a fifth conductor comprising a fifth conductive plane area;

a sixth conductor comprising a sixth conductive plane area;

a seventh conductor comprising a seventh conductive plane area;

an eighth conductor comprising an eighth conductive plane area;

a ninth conductor comprising a ninth conductive plane area;

a tenth conductor comprising a tenth conductive plane area; and wherein said first conductor, said third conductor and said fifth conductor are conductively coupled to one another, and wherein said first conductor, said third conductor and said fifth conductor are electrically insulated from said second conductor and said fourth conductor;

wherein a portion of said second area is arranged a first distance from said first side of said portion of said third area, and wherein said portion of said second area is between a portion of said first area and said first side of said portion of said third area, and wherein said portion of said second area is substantially parallel with said portion of said first area, said first side of said portion of said third area, said second side of said portion of said third area, a portion of said fourth area, and a portion of said fifth area;

wherein said portion of said fourth area is arranged a second distance from said second side of said portion of said third area, and wherein said portion of said fourth area is between said portion of said fifth area and said second side of said portion of said third area, and wherein said portion of said fourth area is substantially parallel with said portion of said first area, said portion of said second area, said first side of said portion of said third area, said second side of said portion of said third area, and said portion of said fifth area;

wherein said first distance is substantially the same as said second distance; and wherein said portion of said second area and said portion of said fourth area are oriented facing each other, and wherein said portion of said second area is shielded from said portion of said fourth area by said first side of said portion of said third area and said second side of said portion of said third area.

12. The energy pathway arrangement of claim 11, wherein said first conductor, said third conductor and said fifth conductor are electrically insulated from said seventh conductor and said ninth conductor.

13. The energy pathway arrangement as recited in claim 12, wherein said second conductor and said fourth conductor are electrically insulated from each other.

14. The energy pathway arrangement as recited in claim 13, wherein said portion of said second area and said portion of said fourth area are arranged in a substantially superposed alignment with each other.

15. The energy pathway arrangement as recited in claim 13, wherein said seventh conductor and said ninth conductor are conductively coupled to each other.

16. An energized circuit incorporating the energy pathway arrangement of claim 14, wherein said third area sustains a first voltage for a first energy propagating said portion of said second area; and wherein said third area sustains said first voltage for a second energy propagating said portion of said fourth area.

17. The energy pathway arrangement as recited in claim 14, wherein said first side of said portion of said third area is larger than said portion of said second area, and wherein said second side of said portion of said third area is larger than said portion of said fourth area.

18. The energy pathway arrangement as recited in claim 11, wherein said first side of said portion of said third area is larger than said portion of said second area, and wherein said second side of said portion of said third area is larger than said portion of said fourth area, and wherein said portion of said second area is substantially the same size as said portion of said fourth area; and wherein said portion of said second area is in a first position relative to said portion of said fourth area, and wherein said portion of said fourth area is in a second position relative to said portion of said second area, and wherein said first position of said portion of said second area overlaps said second position of said portion of said fourth area.

19. An energized energy pathway arrangement of claim 18, wherein said energy pathway arrangement further comprises:

a first capacitance having a capacitive value, wherein said first capacitance is operable between said first side of said portion of said third area and said portion of said second area;

a second capacitance having a capacitance value, wherein said second capacitance is operable between said second side of said portion of said third area and said portion of said fourth area;

a third capacitance having a capacitance value, wherein said third capacitance is operable between said portion of said second area and said portion of said fourth area; and wherein said capacitance value of said first capacitance is substantially the same as said capacitance value of said second capacitance, and wherein said capacitance value of said third capacitance is approximately half of said capacitance value of said first capacitance.

20. A substrate for an integrated circuit chip, comprising:

a first surface of said substrate;

an energy pathway arrangement, wherein said energy pathway arrangement includes:

a first conductor including a first conductive plane area, wherein said first area is under said first surface;

a second conductor including a second conductive plane area, wherein said second area is between said first area and said first surface, and wherein said second area is above said first area;

a third conductor including a third conductive plane area, wherein said third area is between said second area and said first surface, and wherein said third area is above said second area;

a fourth conductor including a fourth conductive plane area, wherein said fourth area is between said third area and said first surface, and wherein said fourth area is above said third area;

a fifth conductor including a fifth conductive plane area, wherein said fifth area is between said fourth area and said first surface, and wherein said fifth area is above said fourth area; and wherein said first conductor, said third conductor and said fifth conductor are conductively coupled to one another, and wherein said first conductor, said third conductor and said fifth conductor are electrically insulated from said second conductor and said fourth conductor, and wherein said second conductor and said fourth conductor are electrically insulated from each other;

wherein a portion of said second area is arranged substantially parallel with a portion of said first area, a portion of said third area, a portion of said fourth area, and a portion of said fifth area;

wherein said portion of said fourth area is arranged substantially parallel with said portion of said first area, said portion of said third area, and said portion of said fifth area;

wherein said portion of said second area is substantially the same size as said portion of said fourth area, and wherein said portion of said second area is shielded from said portion of said fourth area by said portion of said third area, and wherein said portion of said second area and said portion of said fourth area are each oriented facing the other, and wherein said portion of said second area and said portion of said fourth area are arranged in a substantially superposed alignment with each other; and wherein said second conductor is operable for conductive connection to a first part of an integrated circuit chip, and wherein said fourth conductor is operable for conductive connection to a second part of said integrated circuit chip.

* * * * *

UNITED STATES PATENT AND TRADEMARK OFFICE
CERTIFICATE OF CORRECTION

PATENT NO. : 7,688,565 B2
APPLICATION NO. : 12/030253
DATED : March 30, 2010
INVENTOR(S) : Anthony A. Anthony and William M. Anthony Page 1 of 4

It is certified that error appears in the above-identified patent and that said Letters Patent is hereby corrected as shown below:

In the drawings, sheets 6 and 7, consisting of Figures 6 and 7 should be replaced with the two attached sheets.

Column 2, line 60, "Nov. 17, 2001" should be changed to --Nov. 15, 2001--.

Column 3, line 56, "discreet or non-discreet" should be changed to --discrete or non-discrete--.

Column 4, line 11, "resent" should be changed to --present--.

Column 6:
-line 41, "pathway-soured" should be changed to --pathway-sourced--.
-line 44, "maybe" should be changed to --may be--.

Column 7:
-line 37, "paring" should be changed to --pairing--.
-line 38, "1 C" should be changed to --1C--.

Column 8, line 23, "pathway" should be deleted.

Column 10, line 28, "," should be changed to --.--.

Column 12, line 17, "." should be deleted.

Column 13, line 21, "pathway" should be deleted.

Column 17:
-line 11, "800-IM-1" should be changed to --800-1-IM--.
-line 32, "1 B and 1 C" should be changed to --1B and 1C--.
-lines 35 and 40, each "co-planer" should be changed to --co-planar--.

Signed and Sealed this
Tenth Day of April, 2012

David J. Kappos
*Director of the United States Patent and Trademark Office*

CERTIFICATE OF CORRECTION (continued)
U.S. Pat. No. 7,688,565 B2

-line 66, "1 B" should be changed to --1B--.

Column 18:
-line 4, "1 C" should be changed to --1C--.
-line 14, "a" should be deleted.
-lines 66-67, "1099NNE and 1099SSE" should be changed to --1099E and 1099W--.

Column 19:
-line 5, "DOGS" should be changed to --00GS--.
-lines 35-36, "815-1, 800-1, 810-1-IM, 815-2, 800-2-IM, and 810-2" should be changed to --815-1, 800-1-IM, 810-1, 815-2, 800-2-IM, and 810-2--.
-line 38, "-B" should be changed to --815-B--.
-line 39, "820-A and 820-B" should be changed to --800-A and 800-B--.
-lines 40 and 41, each "shields at least" should be changed to --shields of at least--.
-line 41, "825-A and 825-B" should be changed to --835-A and 835-B--.

Column 21:
-line 2, "904" should be changed to --904 (not shown)--.
-line 14, "904" should be changed to --799--.

Column 22:
-line 47, "1099NNE and 10990SSE" should be changed to --1099E and 1099W--.
-line 48, "DOGS" should be changed to --00GS--.
-line 63, "return" should be changed to --return.--.

Column 23, line 7, "an" should be changed to --a--.